United States Patent
Van Dal et al.

(10) Patent No.: US 12,159,942 B2
(45) Date of Patent: *Dec. 3, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Marcus Johannes Henricus Van Dal, Hsinchu (TW); Gerben Doornbos, Hsinchu (TW); Georgios Vellianitis, Hsinchu (TW); Mauricio Manfrini, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/359,690

(22) Filed: Jul. 26, 2023

(65) Prior Publication Data
US 2023/0387327 A1 Nov. 30, 2023

Related U.S. Application Data

(63) Continuation of application No. 17/233,899, filed on Apr. 19, 2021, now Pat. No. 11,791,420.

(51) Int. Cl.
*H01L 29/786* (2006.01)
*H01L 29/66* (2006.01)
(52) U.S. Cl.
CPC .. *H01L 29/78696* (2013.01); *H01L 29/66742* (2013.01); *H01L 29/78618* (2013.01); *H01L 29/7869* (2013.01)

(58) Field of Classification Search
CPC ......... H01L 29/78696; H01L 29/66742; H01L 29/78618; H01L 29/7869; H01L 27/1225;
(Continued)

(56) References Cited

U.S. PATENT DOCUMENTS 9,466,727 B1 10/2016 Hsu et al.
11,791,420 B2 * 10/2023 Van Dal ............ H01L 29/66969
257/288

(Continued)

FOREIGN PATENT DOCUMENTS

JP 2013-246248 A 12/2013
JP 2014-170841 A 9/2014
(Continued)

OTHER PUBLICATIONS

Korean Office Action for Korean Application No. 10-2022-0027916, dated Dec. 20, 2023, with an English translation.
(Continued)

*Primary Examiner* — Tong-Ho Kim
(74) *Attorney, Agent, or Firm* — Birch, Stewart, Kolasch & Birch, LLP

(57) ABSTRACT

A semiconductor device includes a channel layer, source/drain contacts, and first barrier liners. The channel layer includes an oxide semiconductor material. The source/drain contacts are disposed in electrical contact with the channel layer. The first barrier liners surround the source/drain contacts, respectively, and include a hydrogen barrier material so as to prevent hydrogen from diffusion through the first barrier liners to the channel layer.

20 Claims, 26 Drawing Sheets

(58) Field of Classification Search
CPC ............... H01L 29/66969; H01L 29/24; H01L 29/78606
USPC .......................................................... 257/288
See application file for complete search history.

(56) References Cited

U.S. PATENT DOCUMENTS

| | | | |
|---|---|---|---|
| 2011/0084272 | A1 | 4/2011 | Miyanaga et al. |
| 2012/0064664 | A1 | 3/2012 | Yamazaki et al. |
| 2012/0112183 | A1 | 5/2012 | Endo et al. |
| 2015/0249156 | A1 | 9/2015 | Ohguro et al. |
| 2019/0172921 | A1 | 6/2019 | Dewey et al. |
| 2020/0388679 | A1 | 12/2020 | Song et al. |

FOREIGN PATENT DOCUMENTS

| | | |
|---|---|---|
| JP | 2016-157933 A | 9/2016 |
| JP | 2017-120896 A | 7/2017 |
| JP | WO2019/166906 A1 | 9/2019 |
| KR | 10-2020-0126987 A | 11/2020 |

OTHER PUBLICATIONS

Japanese Office Action for Japanese Application No. 2022-068005, dated May 23, 2023, with an English translation.
Taiwanese Search Report for Taiwanese Application No. 111102387, dated Apr. 19, 2023, with an English translation.
U.S. Office Action for U.S. Appl. No. 17/234,015, dated Mar. 9, 2023.
U.S. Office Action for U.S. Appl. No. 17/234,015, dated Nov. 3, 2022.
Yu et al., "Tungsten-Doped Indium Oxide Thin Film as an Effective High-Temperature Copper Diffusion Barrier," ECS Solid State Letters, vol. 3, No. 6, 2014, pp. N15-N17.
Japanese Office Action for Japanese Application No. 2022-068005, dated Nov. 14, 2023, with an English translation.
Korean Office Action for Korean Application No. 10-2022-0027916, dated Jul. 3, 2024, with English translation.

* cited by examiner

SEMICONDUCTOR DEVICE AND METHOD FOR MANUFACTURING THE SAME

REFERENCE TO RELATED APPLICATION

This application is a continuation application of U.S. patent application Ser. No. 17/233,899, filed on Apr. 19, 2021, the contents of which is incorporated herein by reference in its entirety.

BACKGROUND

There is a continuous need to increase feature density in integrated circuits. Therefore, periphery devices may be considered to be moved from the front-end-of-line (FEOL) to the back-end-of-line (BEOL) so as to increase the feature density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
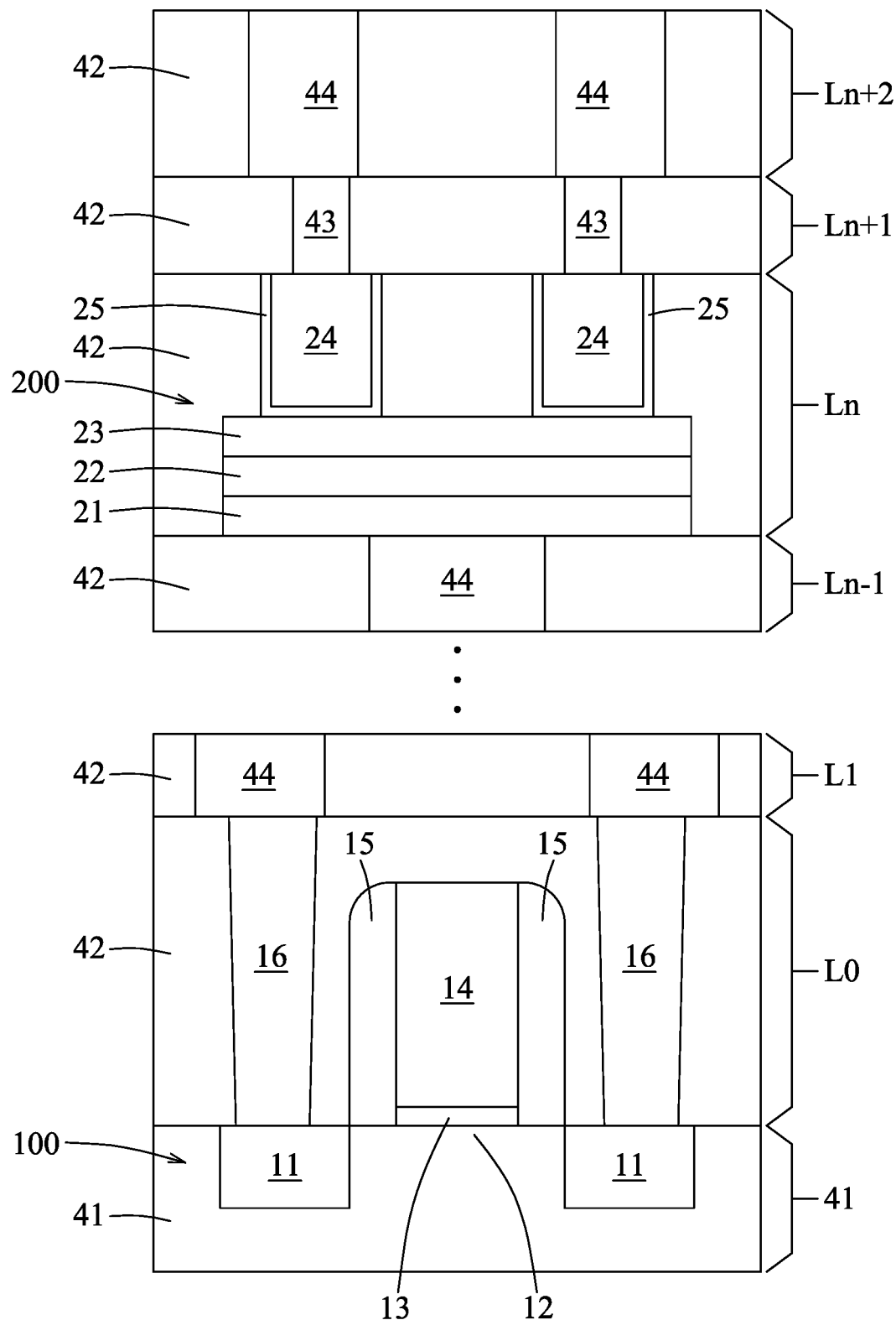
FIG. 1 is a schematic cross-sectional view illustrating an integrated circuit in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device, and methods for manufacturing the same. Especially, embodiments also include a semiconductor device located in the BEOL. The semiconductor device may be used in, for example, but not limited to, a 20 nanometer (N20) generation device, a 16 nanometer (N16) generation device, a 10 nanometer (N10) generation device, or other generation devices.

Thin film transistors (TFTs) are attractive for the BEOL integration since they may be processed at a low temperature and may add functionality to the BEOL and do not use up the valuable area in the FEOL. As a possible scaling path for 3 nm node fabrication (N3) or beyond, peripheral devices from the FEOL may be moved into higher metal levels of the BEOL. This may result in about 5-10% area shrink. The TFTs for serving as the peripheral devices may include, for example, but not limited to, power gates, input/output (I/O) devices, and selectors for memory elements, and those peripheral devices are currently located in the FEOL. The power gates may be logic transistors for switching off logic blocks in standby, thereby reducing static power consumption. The I/O devices are the interface between a computing element (e.g. CPU) and the outside world (e.g., a hard drive). The selector for a memory element may include a magnetoresistive random-access memory (MRAM) or a resistive random-access memory (RRAM), and one selector is typically for each memory element.

A channel layer of the thin film transistor in the BEOL may be sensitive to hydrogen gas and/or free hydrogen atoms which may be generated or used in many processes, such as chemical vapor deposition (CVD). Upon an annealing process, hydrogen gas and/or free hydrogen atoms may be incorporated into the deposited material, and may diffuse to reach and react with the channel layer. In the following, InGaZnO$_4$ is exemplified as a material of the channel layer, and the 2H is used to represent the hydrogen gas or two free hydrogen atoms. A reaction between the hydrogen gas (or free hydrogen atoms) and the channel layer may be represented as follow: 2H+InGaZnO$_4$→H$_2$O+InGaZnO$_3$—O$_{vacancy}$. The O$_{vacancy}$ acts as a donor state, and thus the channel layer is doped, which may change the electrical properties of the channel layer and may lead to strong negative threshold voltage shift.

FIG. 1 illustrates a schematic cross-sectional view of an integrated circuit in accordance with some embodiments. The integrated circuit may include a semiconductor device 100 (which serves as a FEOL transistor), and a semiconductor device 200 (which serves as a BEOL transistor). The semiconductor device 200 may be a thin film transistor in which two barrier liners 25 are formed to respectively surround source/drain contacts 24 so as to prevent hydrogen gas and/or free hydrogen atoms from diffusing through the barrier liners 25. In some embodiments, the barrier liners 25 may absorb the hydrogen gas and/or the free hydrogen atoms by reaction, thereby being doped by the hydrogen gas and/or the free hydrogen atoms. In alternative embodiments, the hydrogen gas and/or the free hydrogen atoms may be stored in the barrier liners 25. In addition, because the hydrogen may dope the barrier liners 25, a Schottky barrier may be improved and a contact resistance may be reduced.

Referring to FIG. 1, the integrated circuit may include a substrate 41, the FEOL semiconductor device 100, the BEOL semiconductor device (e.g., the thin film transistor) 200, a contact-level structure L0, and interconnect-level structures L1 to Ln+2. In some embodiments, the substrate 41 may include, for example, but not limited to, silicon or other suitable semiconductor materials. In alternative embodiments, the substrate 41 may be an SOI (silicon-on-insulator) substrate, an SOS (silicon-on-sapphire) substrate, or other suitable substrates. The semiconductor device 100 may include two source/drain regions 11 formed in the substrate 41, a channel region 12 located between the two source/drain regions 11, a gate dielectric 13 formed over the channel region 12 in the contact-level structure L0, a gate electrode 14 formed on the gate dielectric 13 in the contact-level structure L0, and two spacers 15 formed at two opposite sides of the gate electrode 14. In the contact-level structure L0, source/drain contacts 16 may be formed in a dielectric layer 42 to be in electrical contact with the source/drain regions 11, respectively. The source/drain regions 11 may be p-type or n-type doped regions based on electrical biasing. Each of the interconnect-level structures L1 to Ln+1 may include a dielectric layer 42 which is similar to that of the contact-level structure L0, and may include one or more connectors such as contact via(s) 43 and/or metal line(s) 44 formed in the dielectric layer 42.

The semiconductor device 200 (which may serve as a periphery device) may be or may not be disposed directly above the semiconductor device 100. The semiconductor device 200 is located in the interconnect-level structure Ln, and may include a gate electrode 21 formed to be connected to a connector (such as the metal line 44) in the interconnect-level structure Ln−1, a gate dielectric layer 22 (which may also be referred to as a high-k dielectric layer) disposed on the gate electrode 21, a channel layer 23 disposed on the gate dielectric layer 22, the two source/drain contacts 24 formed on the channel layer 23, and the two barrier liners 25 each surrounding a respective one of the source/drain contacts 24.

In some embodiments, the source/drain contacts 24 may serve as a source and a drain of the semiconductor device 200, respectively, although they are not so limited. In alternative embodiments, two source/drain patterns (not shown) may be formed between the channel layer 23 and the source/drain contacts 24 to respectively serve a source and a drain of the semiconductor device 200.

Figure 2:
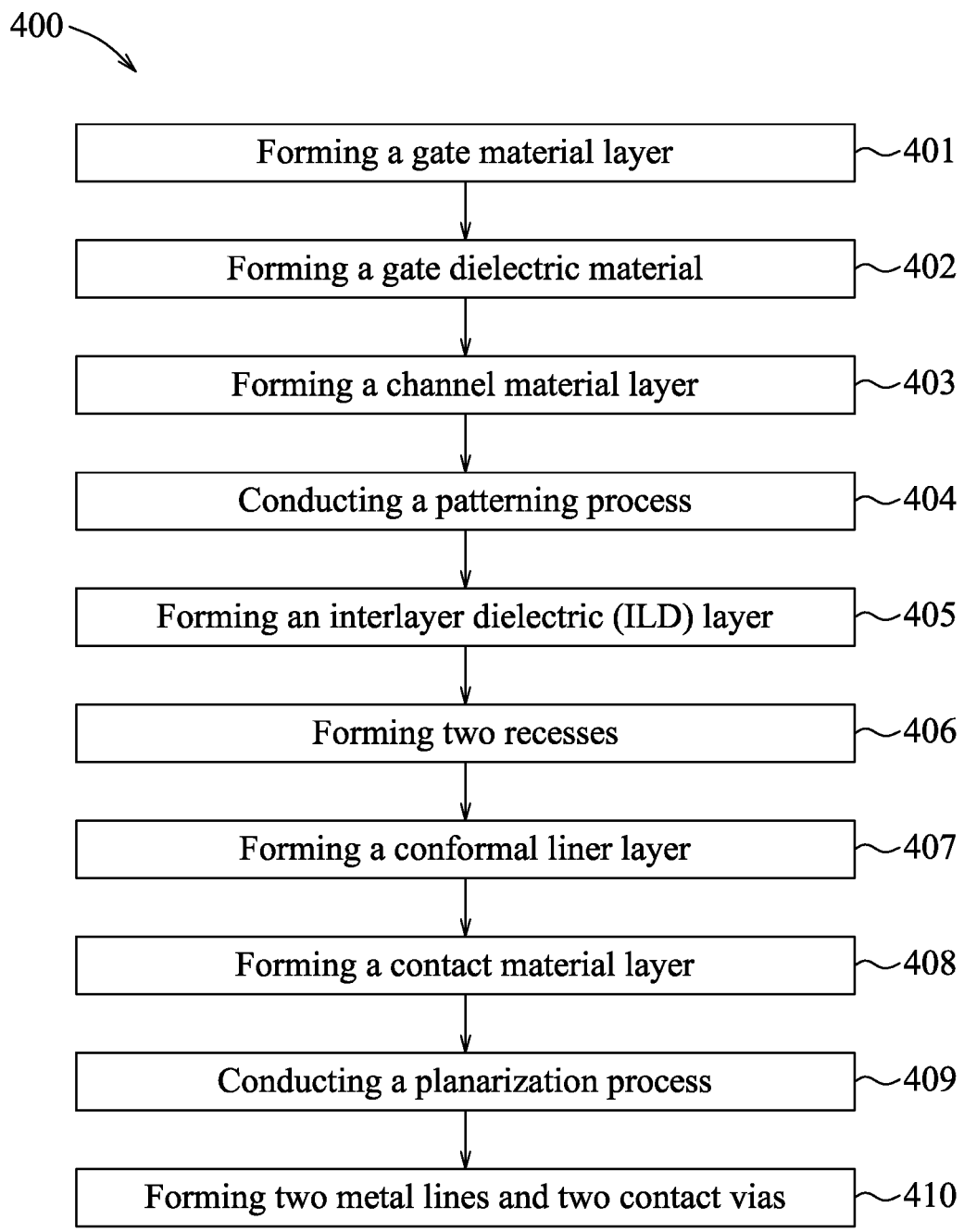
FIG. 2 is a flow diagram illustrating a method for manufacturing a semiconductor structure (a portion of the integrated circuit of FIG. 1) in accordance with some embodiments.

FIG. 2 is a flow diagram illustrating a method 400 for manufacturing a semiconductor structure in accordance with some embodiments. The semiconductor structure may be exemplified as the interconnect-level structures Ln−1 to Ln+2 in FIG. 1, and may include the semiconductor device 200. FIGS. 3 to 13 illustrate schematic views of the intermediate stages of the method 400.

Figure 3:
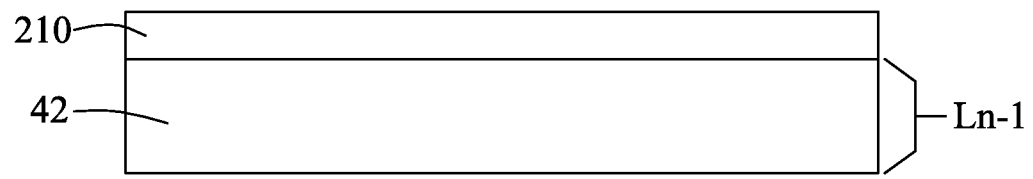
FIGS. 3 to 13 are schematic views illustrating intermediate stages of a method for manufacturing the semiconductor structure in accordance with some embodiments as depicted in FIG. 2.

Referring to FIGS. 2 and 3, the method 400 begins at step 401, where a gate material layer 210 is formed. In some embodiments, the gate material layer 210 may be formed on the dielectric layer 42 of the interconnect-level structure Ln−1 (also shown in FIG. 1). The gate material layer 210 may include a metallic material, a metal compound, polycrystalline silicon, or doped silicon. Other suitable gate materials are within the contemplated scope of the present disclosure. The metallic material may include, for example, but not limited to, silver, aluminum, copper, tungsten, nickel, other suitable materials, alloys thereof, or combinations thereof. The metal compound may include, for example, but not limited to, titanium nitride, tantalum nitride, metal silicide, other suitable materials, or combinations thereof. The gate material layer 210 may be deposited by, for example, but not limited to, CVD, physical vapor deposition (PVD), sputtering, plating, combinations thereof, or other suitable techniques.

Figure 4:
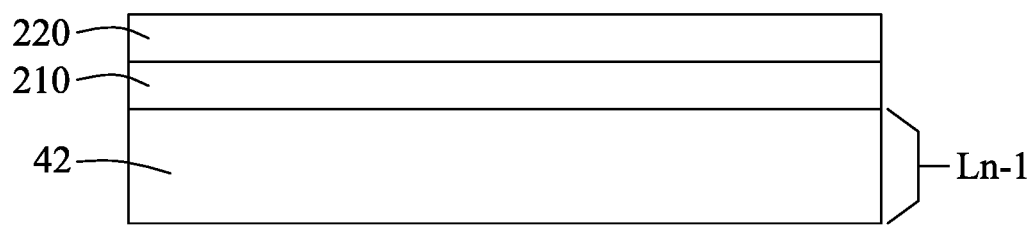

Referring to FIGS. 2 and 4, the method 400 proceeds to step 402, where a gate dielectric material 220 is formed on the gate material layer 210. The gate dielectric material 220 may include, but not limited to, silicon oxide, silicon nitride, silicon oxynitride, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide (Al$_2$O$_3$), a hafnium dioxide-alumina (HfO$_2$—Al$_2$O$_3$) alloy, or combinations thereof. Other suitable gate dielectric materials are within the contemplated scope of the present disclosure. The gate dielectric material 220 may be deposited by, for example, but not limited to, sputtering, CVD, PVD, atomic layer deposition (ALD), plasma-enhanced ALD, molecular beam epitaxy (MBE), combinations thereof, or other suitable techniques. In some embodiments, the gate dielectric material 220 may be constructed in a single-layer form. In alternative embodiments, the gate dielectric material 220 may include a plurality of films with different materials.

Figure 5:
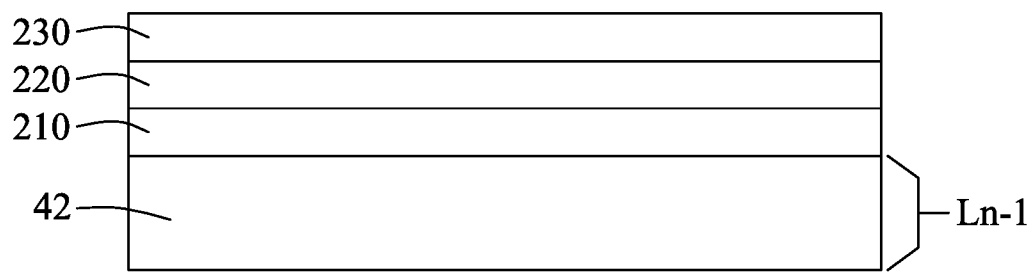

Referring to FIGS. 2 and 5, the method 400 proceeds to step 403, where a channel material layer 230 is formed on the gate dielectric material 220. The channel material layer 230 includes an oxide semiconductor material, for example, but not limited to, indium gallium zinc oxide (InGaZnO, IGZO), tungsten-doped indium oxide (InWO), indium zinc oxide (InZnO), indium tin oxide (InSnO), gallium oxide (GaO$_x$), indium oxide (InO$_x$) and the like. In some embodiments, the channel material layer 230 may further include amorphous silicon, crystalline silicon, or the like. Other suitable channel materials are within the contemplated scope of the present disclosure. Step 403 may be implemented using CVD, PVD, ALD, plasma-enhanced CVD (PECVD), epitaxial growth, or other suitable techniques. In some embodiments, the channel material layer 230 may be constructed in a single-layer form. In alternative embodiments, the channel material layer 230 may include a plurality of films with different materials. In some embodiments, the channel material layer 230 may have a thickness ranging from about 4 nm to about nm although a larger or smaller thickness may be used based on the device performance or the designs of the product to be produced.

Figure 6:
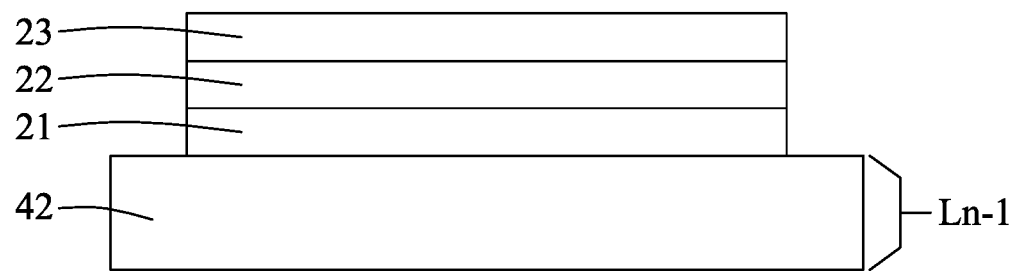

Referring to FIGS. 2 and 6, the method 400 proceeds to step 404, where a patterning process is conducted to pattern the channel material layer 230, the gate dielectric material 220, and the gate material layer 210 shown in FIG. 5 so as to form a channel layer 23, a gate dielectric layer 22, and a gate electrode 21. Step 404 may be implemented using a photolithography process and an etching process. The photolithography process may include, for example, but not limited to, coating a photoresist, soft-baking, exposing the photoresist through a photomask, post-exposure baking, and developing the photoresist, followed by hard-baking so as to form a patterned photoresist. The etching process may be implemented by etching the channel material layer 230, the gate dielectric material 220, and the gate material layer 210 shown in FIG. through the patterned photoresist using, for example, but not limited to, a dry etching process, a wet etching process, other suitable processes, or combinations thereof. In some embodiments, the gate electrode 21 may be in electrical contact with the metal line 44 in the interconnect-level structure Ln−1 shown in FIG. 1.

Figure 7:
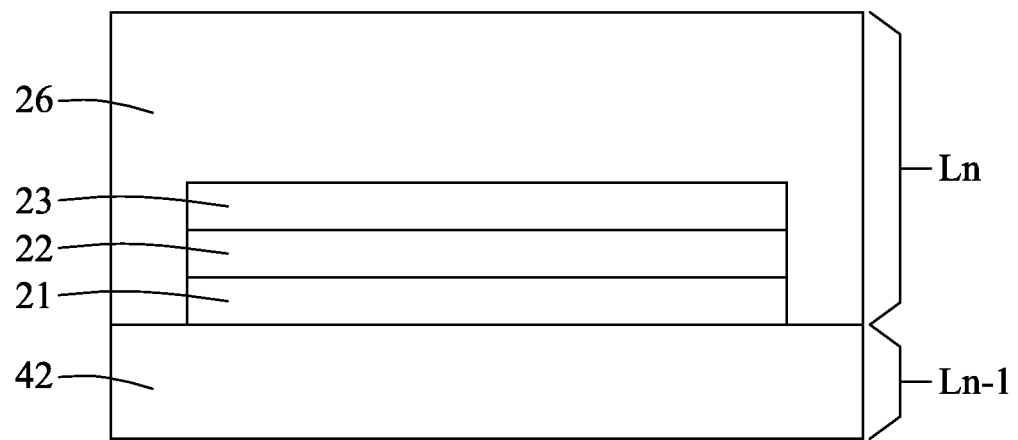

Referring to FIGS. 2 and 7, the method 400 proceeds to step 405, an interlayer dielectric (ILD) layer 26 is formed over a stack of the channel layer 23, the gate dielectric layer 22, and the gate electrode 21. Step 405 may be implemented by depositing a dielectric material layer (not shown) using, for example, but not limited to, CVD, PVD, sputtering, combinations thereof, or other suitable techniques, followed by a chemical mechanical polishing (CMP) process or other suitable techniques to planarize the not-shown dielectric material layer. In some embodiments, the ILD layer 26 may be a single material layer. In alternative embodiments, the ILD layer 26 may be constituted by multiple films with different materials. In some embodiments, the ILD layer 26 may include, but not limited to, polyimide, epoxy resin, acrylic resin, phenol resin, benzocyclobutene (BCB), polybenzooxazole (PBO), other suitable polymer-based dielectric materials, or combinations thereof. In alternative embodiments, the ILD layer 26 may include silicon oxide, silicon oxynitride, or combinations thereof. Other suitable dielectric materials are within the contemplated scope of the present disclosure. In some embodiments, the ILD layer 26 may correspond to the dielectric layer 42 of the interconnect-level structure Ln shown in FIG. 1.

Figure 8:
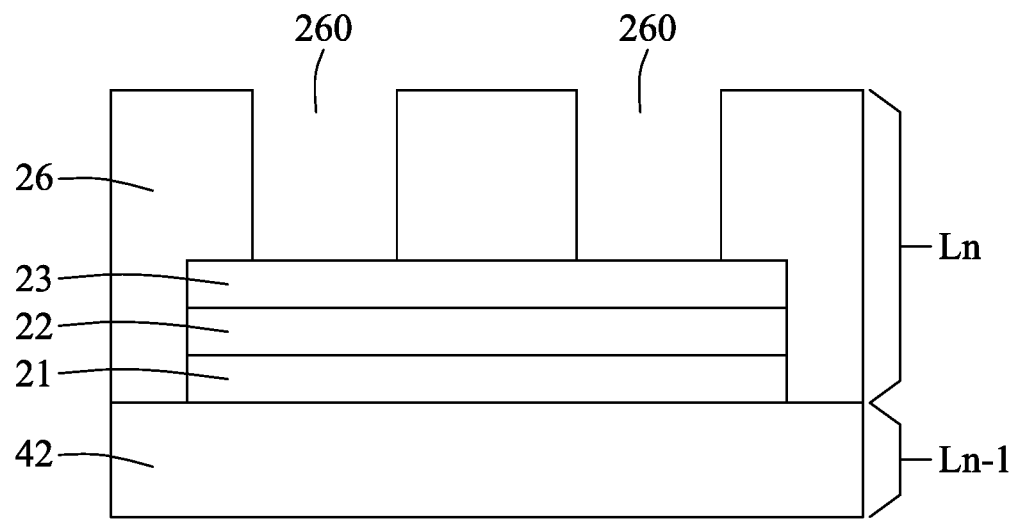

Referring to FIGS. 2 and 8, the method 400 proceeds to step 406, where two recesses 260 are formed in the ILD layer 26 to expose the channel layer 23. The recesses 260 may be formed using a photolithography process and an etching process similar to those described in step 404.

Figure 9:
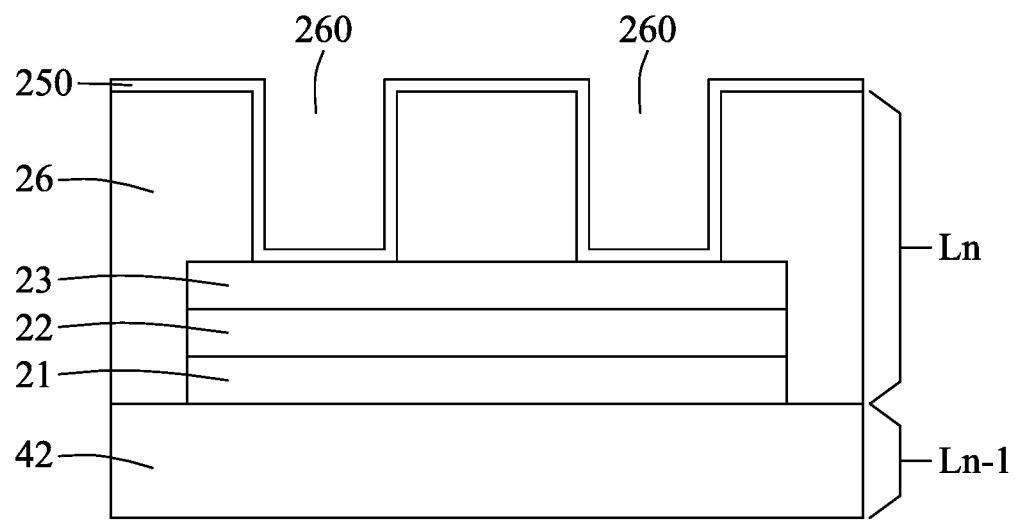

Referring to FIGS. 2 and 9, the method 400 proceeds to step 407, where a conformal liner layer 250 is formed over the ILD layer 26 and along inner recess surfaces of the recesses 260. The conformal liner layer 250 may include a hydrogen barrier material, for example, but not limited to, In-rich oxide material, zinc oxide (e.g., ZnO), gallium oxide (e.g., $Ga_2O_3$), $Zr_xNi_y$, or combinations thereof. To be specific, $Zr_xNi_y$ is a metal compound including Zr (zirconium) and Ni (nickel). Other suitable hydrogen barrier materials are within the contemplated scope of the present disclosure. The In-rich oxide material may include, for example, but not limited to, indium oxide (e.g., InO, $In_2O_3$, etc.), indium gallium zinc oxide (InGaZnO, IGZO), crystalline InGaZnO (c-IGZO), a semiconductor material including indium, gallium, zinc, silicon, and oxide (IGSZO, InGaSiZnOx), tungsten-doped indium oxide (InWO), indium tin oxide (e.g., InSnO), indium zinc oxide (e.g., InZnO), or combinations thereof. Other suitable liner materials are within the contemplated scope of the present disclosure. The conformal liner layer 250 may be formed using CVD, high density plasma CVD (HDPCVD), sub-atmospheric CVD (SACVD), molecular layer deposition (MLD), PVD, sputtering, epitaxial growth, or other suitable techniques. In some embodiments, the conformal liner layer 250 may have a thickness ranging from about 2 nm to about 10 nm although a larger or smaller thickness may be used based on the device performance or the designs of the product to be produced.

Figure 10:
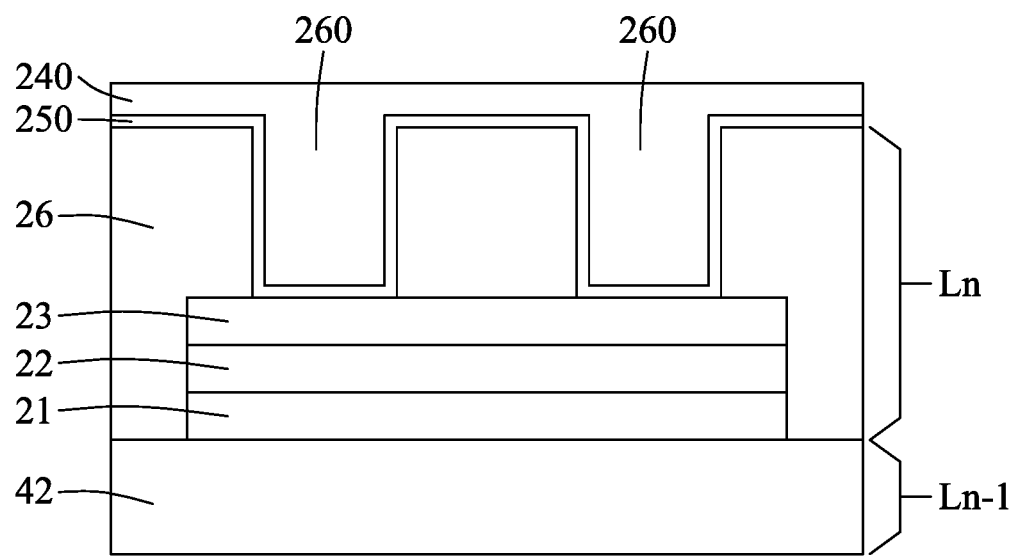

Referring to FIGS. 2 and 10, the method 400 proceeds to step 408, where a contact material layer 240 is formed over the conformal liner layer 250 to fill the recesses 260 shown in FIG. 9. The contact material layer 240 may include, for example, but not limited to, cobalt, tungsten, copper, titanium, tantalum, aluminum, zirconium, hafnium, combinations thereof, or alloys thereof. Other suitable materials are within the contemplated scope of the present disclosure. The contact material layer 240 may be formed using CVD, ALD, plating, or other suitable deposition techniques.

Figure 11:
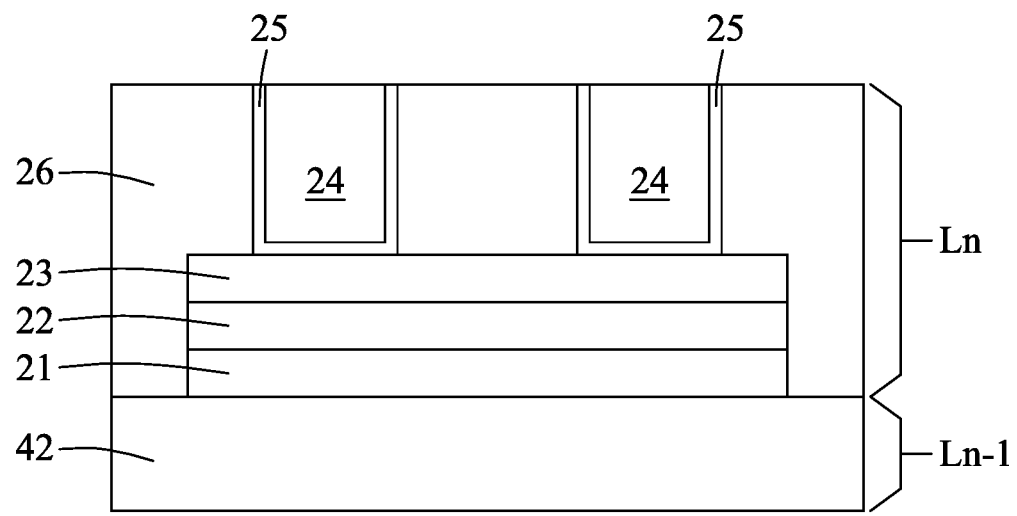

Referring to FIGS. 2 and 11, the method 400 proceeds to step 409, where a planarization process is conducted to remove the excess of the contact material layer 240 and the conformal liner layer 250 on the ILD layer 26 shown in FIG. 10, so as to obtain two source/drain contacts 24 and two barrier liners 25. The source/drain contacts 24 are disposed above the channel layer 23 and are spaced apart from each other. Each of the barrier liners 25 surrounds a respective one of the source/drain contacts 24. Step 409 may be implemented using a CMP process or other suitable techniques.

Figure 12:
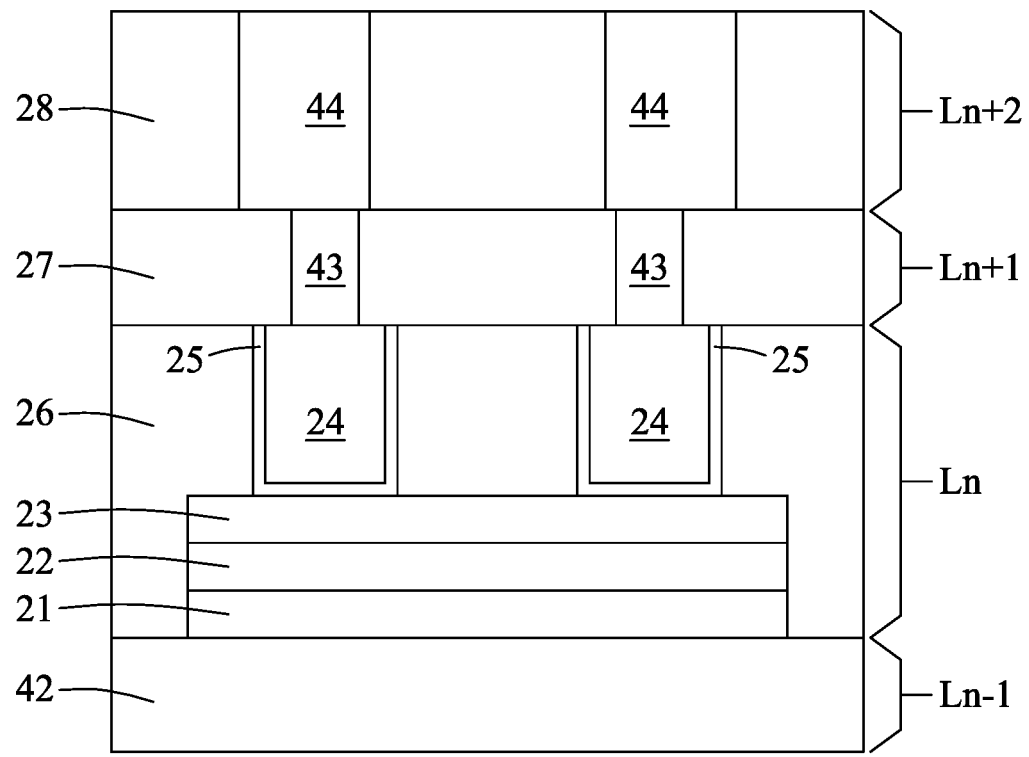
Figure 13:
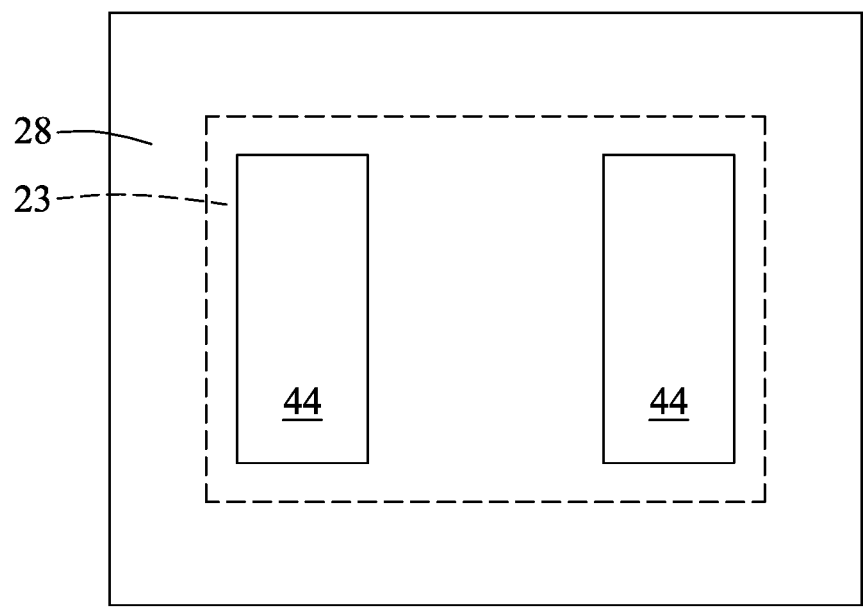

Referring to FIGS. 2 and 12, the method 400 proceeds to step 410, where two contact vias 43 are formed in an ILD layer 27, and two metal lines 44 are formed in an ILD layer 28. FIG. 13 is a top view of FIG. 12. The ILD layers 27, 28 may correspond to the dielectric layers 32 of the interconnect-level structures Ln+1, Ln+2 shown in FIG. 1, respectively. The contact vias 43 and the metal lines 44 in the two interconnect-level structures Ln+1, Ln+2 may be separately formed as two distinct structures using two single damascene processes, or may be simultaneously formed as a unitary structure using a dual damascene process. The materials and the formation for the ILD layers 27, 28 are similar to those for the ILD layer 26 described in step 405. The materials for the metal lines 44 and the contact vias 43 may be similar to those for the source/drain contacts 24.

In alternative embodiments, other suitable methods may also be applied for forming the semiconductor structure shown in FIGS. 12 and 13. In yet alternative embodiments, additional features may be added in the semiconductor structure shown in FIGS. 12 and 13, and some features in the semiconductor structure shown in FIGS. 12 and 13 may be modified, replaced, or eliminated without departure of the spirit and scope of the present disclosure.

Figure 14:
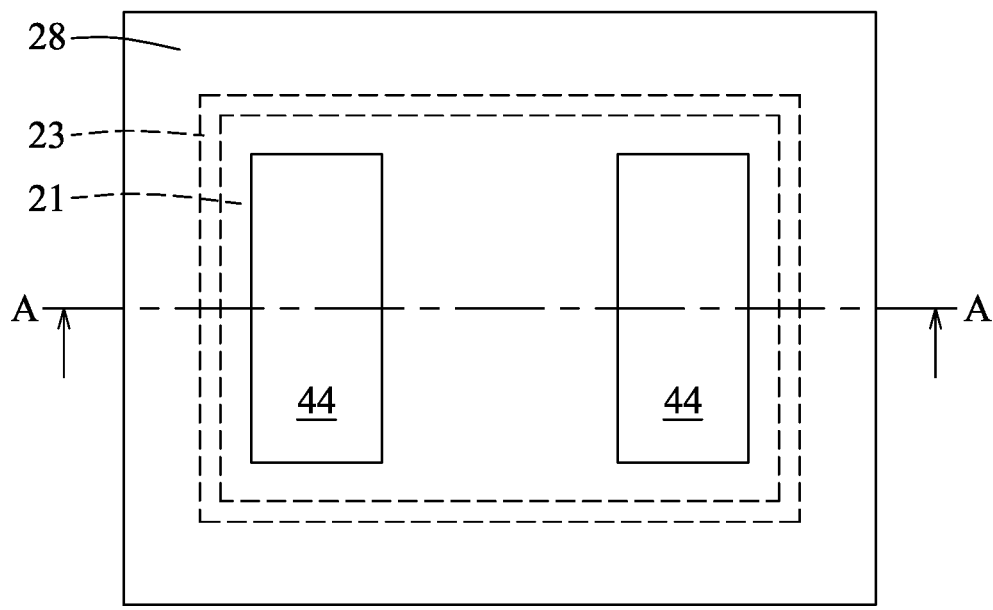
FIG. 14 is a schematic top view of a semiconductor structure in accordance with some embodiments.
Figure 15:
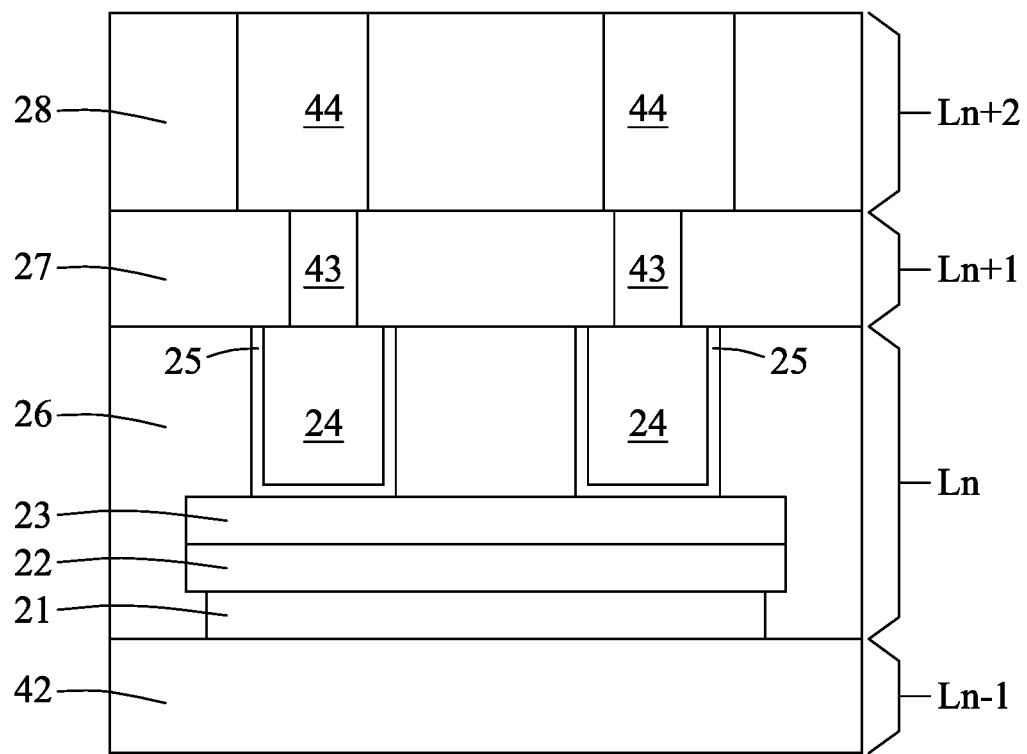
FIG. 15 is a schematic cross-sectional view taken along line A-A of FIG. 14.

FIG. 14 is a schematic top view of a semiconductor structure in accordance with some embodiments. FIG. 15 is a schematic cross-sectional view taken along line A-A of FIG. 14. The semiconductor structure in FIG. 15 is similar to that in FIG. 12 except that the dimensions of the gate dielectric layer 22 and the channel layer 23. In the semiconductor structure shown in FIG. 15, the gate dielectric layer 22 and the channel layer 23 may have a larger dimension than that of the gate electrode 21. The gate electrode 21, the gate dielectric layer 22, and the gate channel layer 23 may be separately formed, and two portions of the ILD layer 26 may be separately formed. Each portion of the ILD layer 26 may be formed in a manner similar to step 405 described above for forming the ILD layer 26. For example, after formation of a portion of the ILD layer 26, the gate electrode 21 shown in FIG. 15 may be formed in the portion of the ILD layer 26 through a damascene gate formation process which may include (i) forming a trench (not shown) in the portion of the ILD layer 26, (ii) depositing a gate material layer (not shown) over the portion of the ILD layer 26 to fill the trench, and (iii) conducting a CMP process or other suitable techniques to remove the excess gate material layer on the portion of the ILD layer 26. Then, the gate dielectric material 220 and the channel material layer 230 shown in FIG. 5 may be formed over the gate electrode 21 and the portion of the ILD layer 26. Next, the patterning process described in step 404 may be used to pattern the channel material layer 230 and the gate dielectric material 220 so as to form the channel layer 23 and the gate dielectric layer 22 shown in FIG. 15. Thereafter, a remaining portion of the ILD layer 26 is formed over the channel layer 23 and the gate dielectric layer 22. The subsequent steps for forming the semiconductor structure shown in FIG. 15 may be similar to steps 406 to 410 described above. In alternative embodiments, other suitable methods may also be applied for forming the semiconductor structure shown in FIGS. 14 and 15. In yet alternative embodiments, additional features may be added in the semiconductor structure shown in FIGS. 14 and 15, and some features in the semiconductor structure shown in FIGS. 14 and 15 may be modified, replaced, or eliminated without departure of the spirit and scope of the present disclosure.

Figure 16:
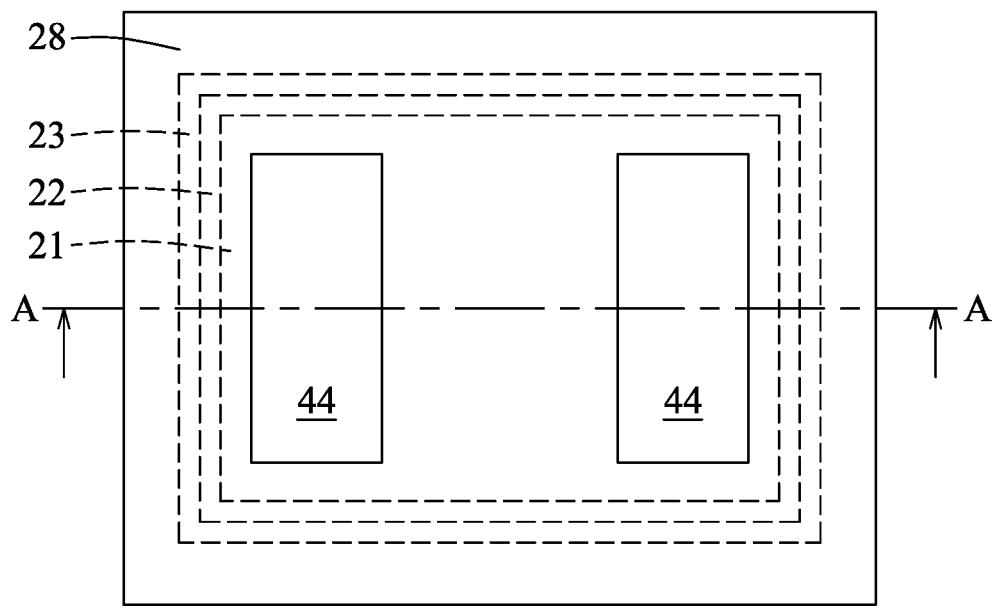
FIG. 16 is a schematic top view of a semiconductor structure in accordance with some embodiments.
Figure 17:
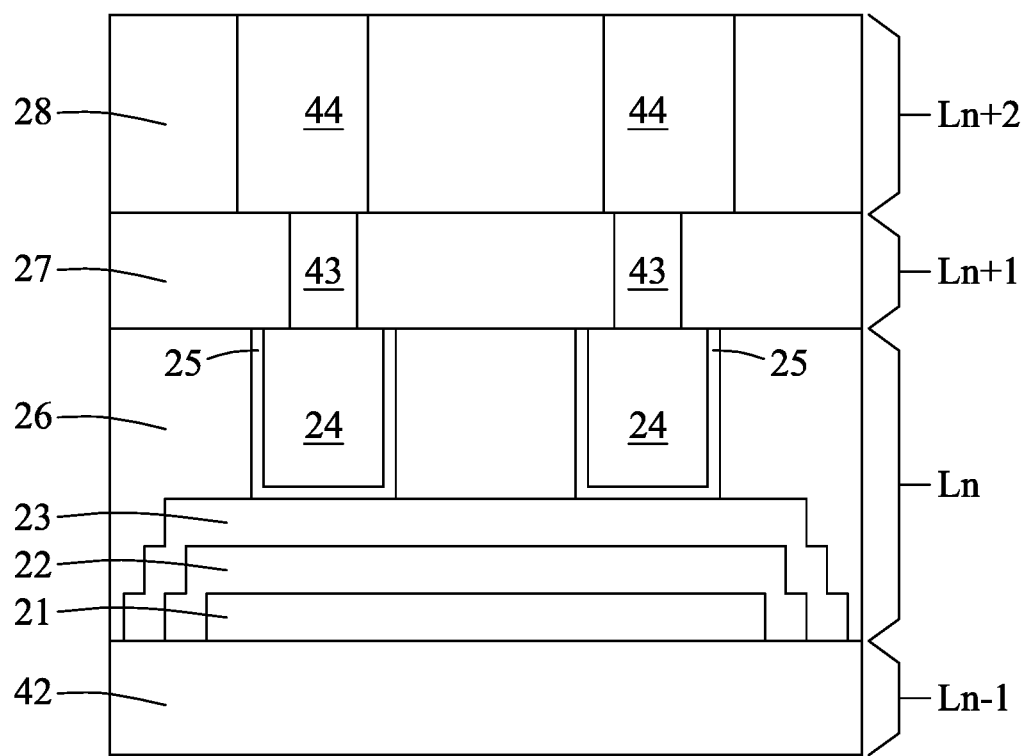
FIG. 17 is a schematic cross-sectional view taken along line A-A of FIG. 16.

FIG. 16 is a schematic top view of a semiconductor structure in accordance with some embodiments. FIG. 17 is a schematic cross-sectional view taken along line A-A of FIG. 16. The semiconductor structure in FIG. 17 is similar to that in FIG. 15, except for the formation of the gate electrode 21. In some embodiments, after the gate electrode 21 is formed on the interconnect-level structure Ln−1, the gate dielectric material 220 and the channel material layer 230 shown in FIG. 5 may be formed over the gate electrode 21 and the interconnect-level structure Ln−1. Next, a patterning process as described in step 404 may be used to pattern the channel material layer 230 and the gate dielectric material 220 so as to form the channel layer 23 and the gate dielectric layer 22 shown in FIG. 17. The subsequent steps for forming the semiconductor structure shown in FIG. 17 may be similar to steps 405 to 410 described above. In alternative embodiments, other suitable methods may also be applied for forming the semiconductor structure shown in FIGS. 16 and 17. In yet alternative embodiments, additional features may be added in the semiconductor structure shown in FIGS. 16 and 17, and some features in the semiconductor structure shown in FIGS. 16 and 17 may be modified, replaced, or eliminated without departure of the spirit and scope of the present disclosure.

Figure 18:
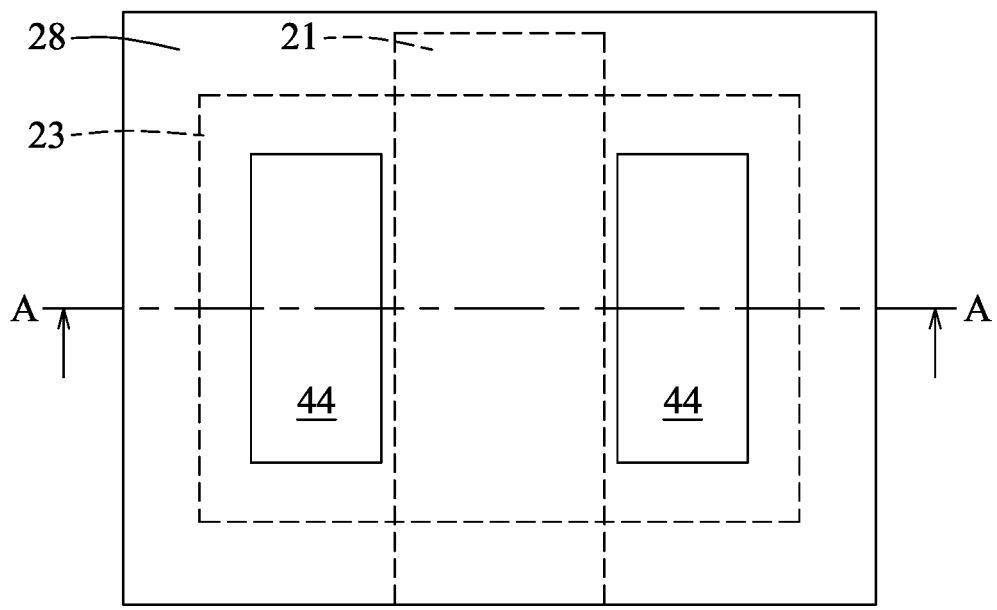
FIG. 18 is a schematic top view of a semiconductor structure in accordance with some embodiments.
Figure 19:
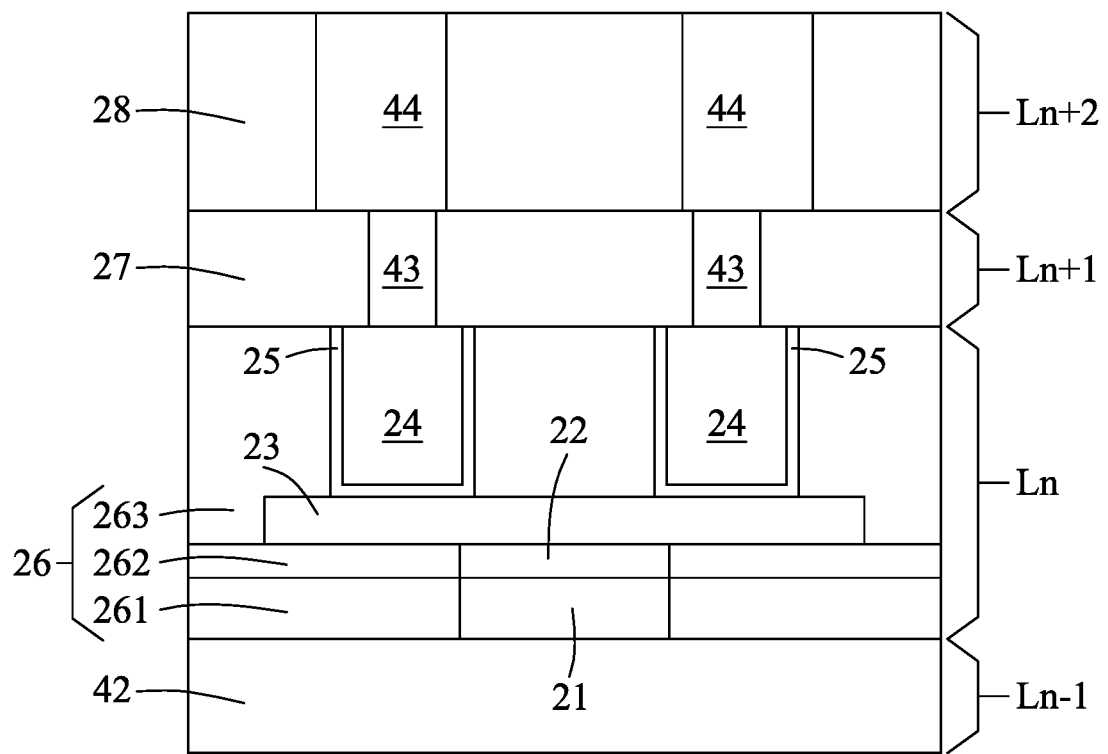
FIG. 19 is a schematic cross-sectional view taken along line A-A of FIG. 18.

FIG. 18 is a schematic top view of a semiconductor structure in accordance with some embodiments. FIG. 19 is a schematic cross-sectional view taken along line A-A of FIG. 18. The semiconductor structure in FIG. 19 is similar to that in FIG. 12, except for the configuration of the gate electrode 21. In the semiconductor structure in FIG. 19, the ILD layer 26 may include a first portion 261, a second portion 262, and a third portion 263, each of which may be separately formed in a manner similar to step 405 described above for forming the ILD layer 26. The gate electrode 21 is formed in the first portion 261, the gate dielectric layer 22 is formed in the second portion 262, and the channel layer 23 is formed in the third portion 263. After formation of the first portion 261 of the ILD layer 26, the gate electrode 21 may be formed in the first portion 261 of the ILD layer 26 through a damascene gate formation process which may include (i) forming a first trench (not shown) in the first portion 261, (ii) depositing a gate material layer (not shown) over the first portion 261 to fill the first trench, and (iii) conducting a CMP process or other suitable techniques to remove the excess gate material layer on the first portion 261. Then, the second portion 262 may be formed over the first portion 261 and the gate electrode 21, and the gate dielectric layer 22 may be formed in the second portion 262 by a process including (i) forming a second trench (not shown) in the second portion 262 to expose the gate dielectric 21, (ii) depositing a gate dielectric material (not shown) over the second portion 262 to fill the second trench, and (iii) conducting a CMP process or other suitable techniques to remove the excess gate dielectric material on the second portion 262. Next, the channel material layer 230 shown in FIG. 5 may be formed over the second portion 262 and the gate dielectric layer 22. A patterning as described in step 404 may be used to pattern the channel material layer 230 so as to form the channel layer 23 shown in FIG. 19. Thereafter, the third portion 263 may be formed over the second portion 262 and the channel layer 23. The subsequent steps for forming the semiconductor structure shown in FIG. 19 may be similar to steps 406 to 410 described above.

Figure 20:
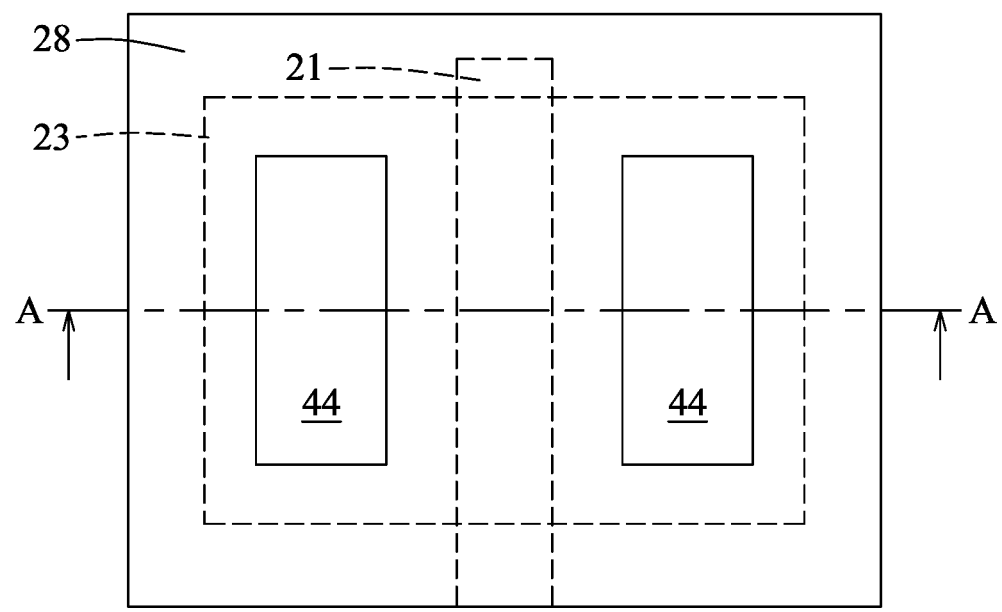
FIG. 20 is a schematic top view of a semiconductor structure in accordance with some embodiments.
Figure 21:
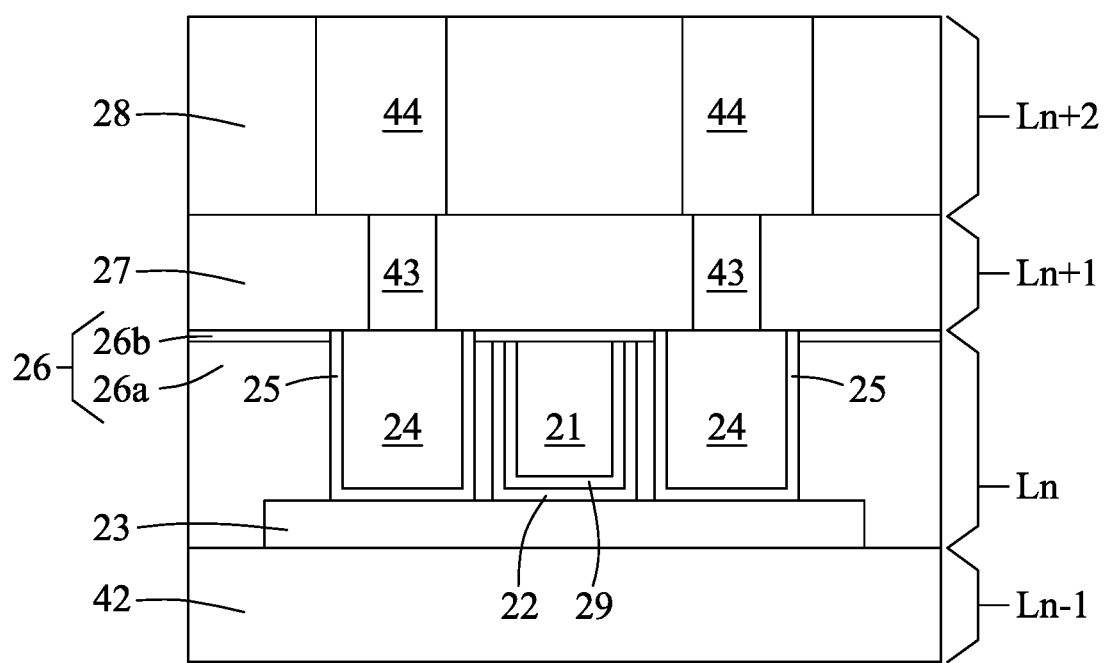
FIG. 21 is a schematic cross-sectional view taken along line A-A of FIG. 20.

FIG. 20 is a schematic top view of a semiconductor structure in accordance with some embodiments. FIG. 21 is a schematic cross-sectional view taken along line A-A of FIG. 20. The semiconductor structure in FIG. 21 is similar to that in FIG. 12, except for the location of the gate electrode 21 and the gate dielectric layer 22. In the semiconductor structure shown in FIG. 21, the gate electrode 21 is located between the source/drain contacts 24, and is surrounded by the gate dielectric layer 22, and a barrier liner 29 is further formed between the gate electrode 21 and the gate dielectric layer 22. The ILD layer 26 may include a first portion 26a and a second portion 26b.

Figure 22:
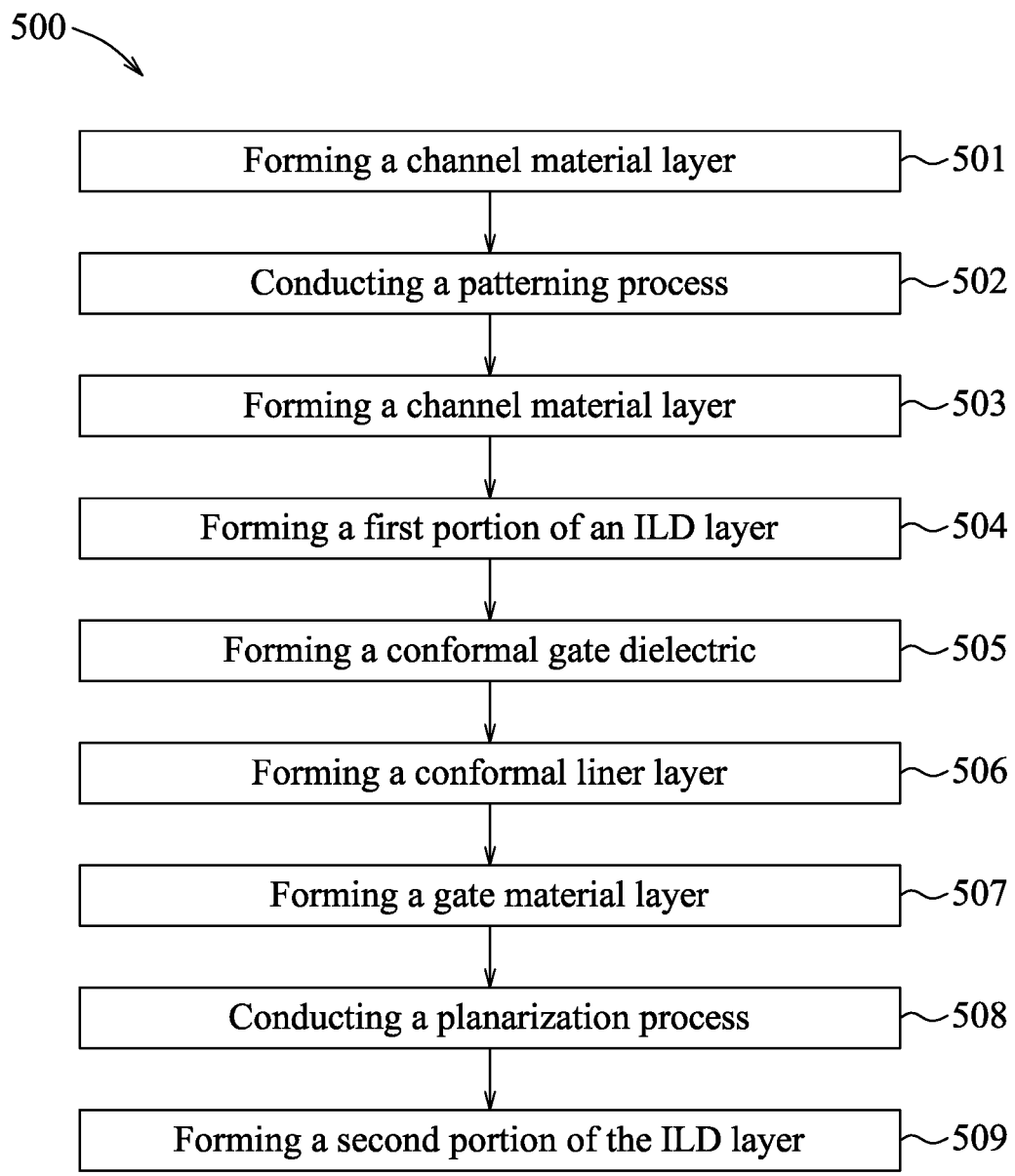
FIG. 22 is a flow diagram illustrating a method for manufacturing a semiconductor structure in accordance with some embodiments.

FIG. 22 is flow diagram illustrating a method 500 for manufacturing a semiconductor structure shown in FIG. 21 in accordance with some embodiments. FIGS. 23 to 31 illustrate schematic views of the intermediate stages of the method 500.

Figure 23:
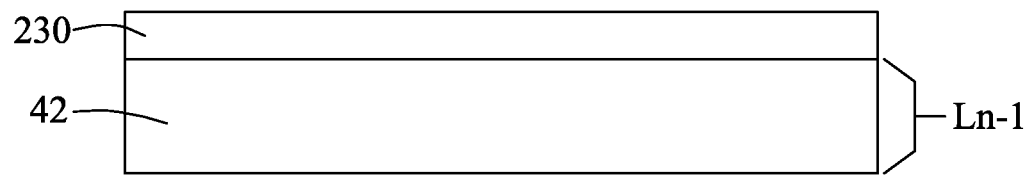
FIGS. 23 to 31 are schematic views illustrating intermediate stages of a method for manufacturing the semiconductor structure in accordance with some embodiments as depicted in FIG. 22.

Referring to FIGS. 22 and 23, the method 500 begins at step 501, where a channel material layer 230 is formed. In some embodiments, the channel material layer 230 may be formed on the dielectric layer 42 of the interconnect-level structure Ln−1 (shown in FIG. 1). The materials and the formation for the channel material layer 230 are similar to those described above in step 403, and the details thereof are omitted for the sake of brevity.

Figure 24:
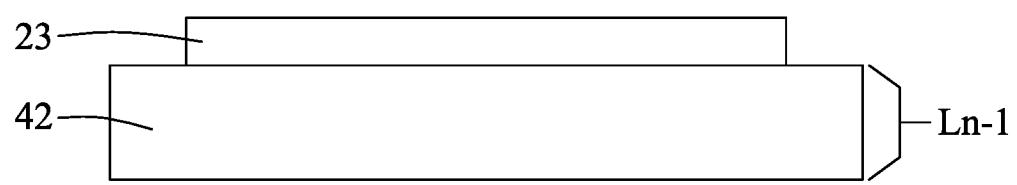

Referring to FIGS. 22 and 24, the method 500 proceeds to step 502, where a patterning process is conducted to pattern the channel material layer 230 so as to form the channel layer 23. The patterning process may be implemented in a manner similar to step 404 described above, and the details thereof are omitted for the sake of brevity.

Figure 25:
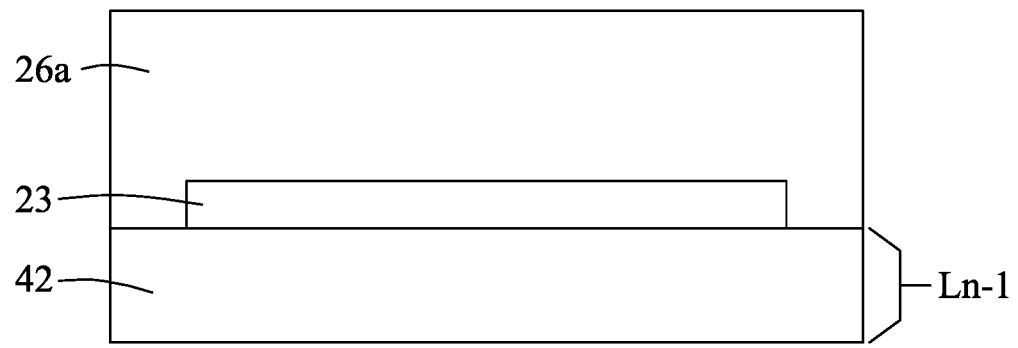

Referring to FIGS. 22 and 25, the method 500 proceeds to step 503, where the first portion 26a of the ILD layer 26 shown in FIG. 21 is formed over the channel layer 23. The first portion 26a may be formed in a manner similar to step 405 described above for forming the ILD layer 26, and the details thereof are omitted for the sake of brevity.

Figure 26:
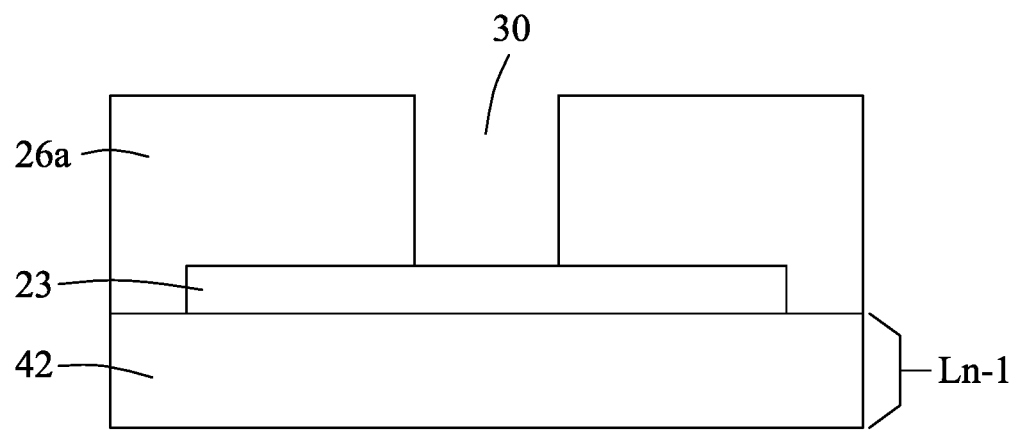

Referring to FIGS. 22 and 26, the method 500 proceeds to step 504, where a trench 30 is formed in the first portion 26a using a photolithography and an etching process similar to those described in step 404, and the details thereof are omitted for the sake of brevity.

Figure 27:
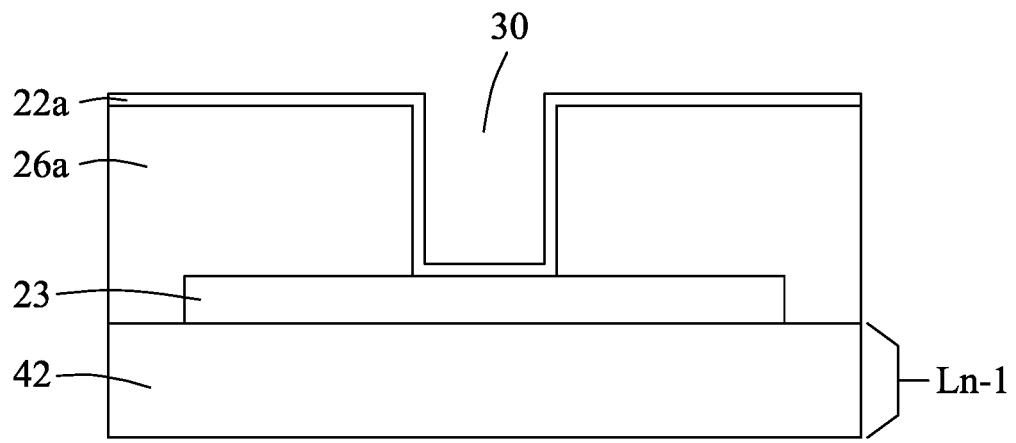

Referring to FIGS. 22 and 27, the method 500 proceeds to step 505, where a conformal gate dielectric 22a is formed over the first portion 26a and along an inner trench surface of the trench 30. The materials and formation for the conformal gate dielectric 22a are similar to those for the gate dielectric material 220 described above in step 402, and the details thereof are omitted for the sake of brevity.

Figure 28:
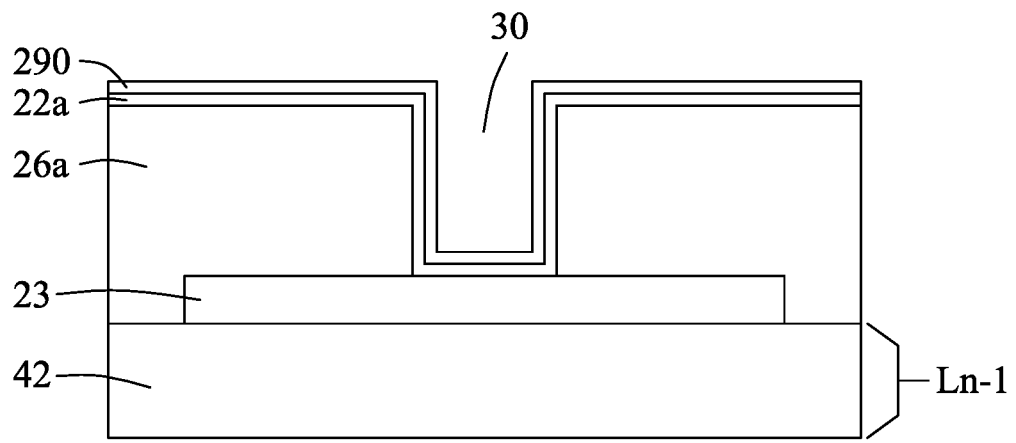

Referring to FIGS. 22 and 28, the method 500 proceeds to step 506, where a conformal liner layer 290 is formed on the conformal gate dielectric 22a. The materials and the formation for the conformal liner layer 290 are similar to those for the conformal liner layer 250 described above in step 407, and the details thereof are omitted for the sake of brevity.

Figure 29:
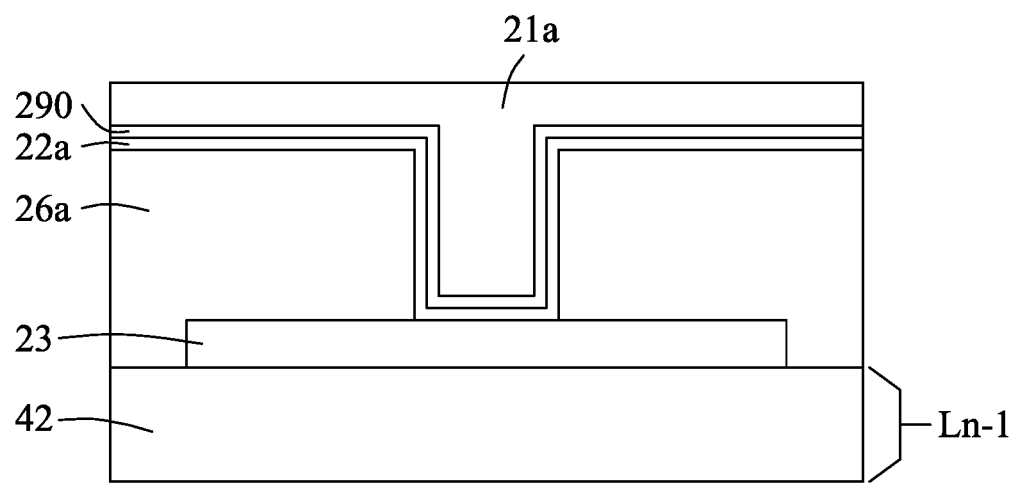

Referring to FIGS. 22 and 29, the method 500 proceeds to step 507, where a gate material layer 21a is formed over the conformal liner layer 290 to fill the trench 30 shown in FIG. 28. The materials and the formation for the gate material layer 21a are similar to those for the gate material layer 210 described above in step 401, and the details thereof are omitted for the sake of brevity.

Figure 30:
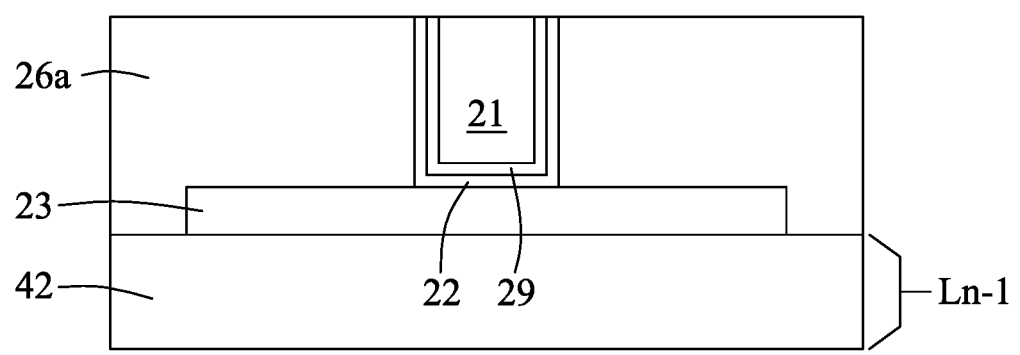

Referring to FIGS. 22 and 30, the method 500 proceeds to step 508, where a planarization process is conducted to remove the excess of the conformal gate dielectric 22a, the conformal liner layer 290, and the gate material layer 21a on the first portion 26a, so as to obtain the gate electrode 21, the gate dielectric layer 22, and the barrier liner 29. Step 508 may be implemented using a CMP process or other suitable techniques.

Figure 31:
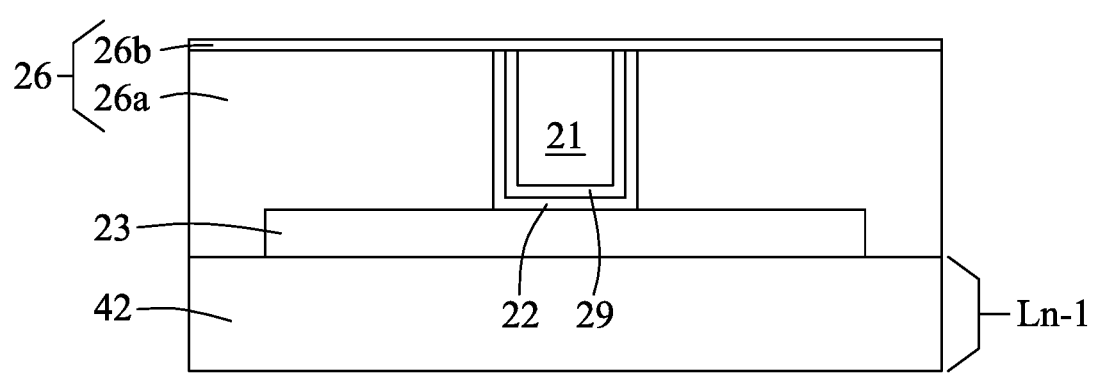

Referring to FIGS. 22 and 31, the method 800 proceeds to step 509, where a second portion 26b of the ILD layer 26 shown in FIG. 21 is formed over the first portion 26a, the gate electrode 21, the gate dielectric layer 22, and the barrier liner 29. The second portion 26b may be formed in a manner similar to step 405 described above for forming the ILD layer 26, and the details thereof are omitted for the sake of brevity.

The subsequent steps for forming the semiconductor structure shown in FIGS. and 21 may be similar to steps 406 to 410 described above. In alternative embodiments, other suitable methods may also be applied for forming the semiconductor structure shown in FIGS. 20 and 21. In yet alternative embodiments, additional features may be added in the semiconductor structure shown in FIGS. 20 and 21, and some features in the semiconductor structure shown in FIGS. 20 and 21 may be modified, replaced, or eliminated without departure of the spirit and scope of the present disclosure.

Figure 32:
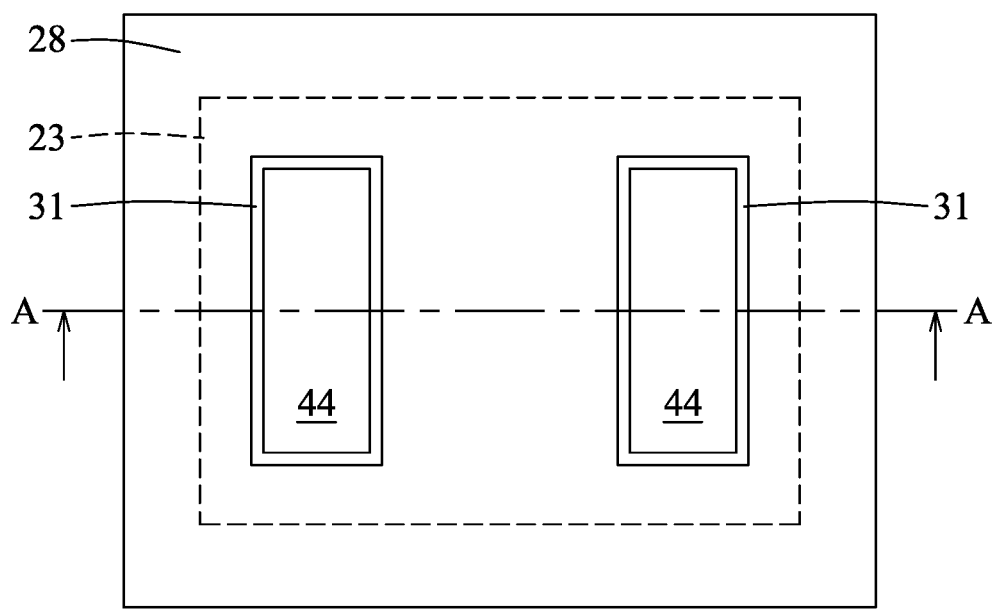
FIG. 32 is a schematic top view of a semiconductor structure in accordance with some embodiments.
Figure 33:
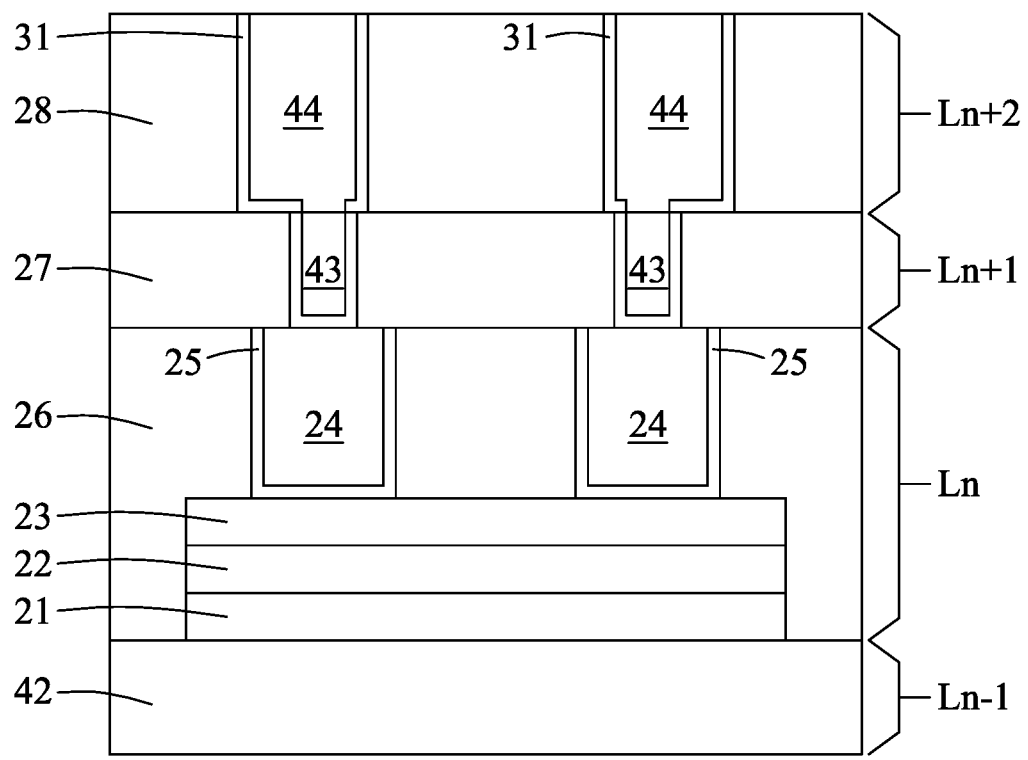
FIG. 33 is a schematic cross-sectional view taken along line A-A of FIG. 32.

FIG. 32 is a schematic top view of a semiconductor structure in accordance with some embodiments. FIG. 33 is a schematic cross-sectional view taken along line A-A of FIG. 32. The semiconductor structure in FIG. 33 is similar to that in FIG. 12, except that the semiconductor structure in FIG. 33 may further include two barrier liners 31 each surrounding one of the contact vias 43 in the interconnect-level structure Ln+1, and a corresponding one of the metal lines 44 in the interconnect-level structure Ln+2.

The semiconductor structure shown in FIG. 33 may be formed using a method 400A in accordance with some embodiments. The method 400A is similar to the method 400 illustrated in FIG. 2, except for step 410. FIGS. 34 to 38 illustrate schematic views of the intermediate stages of step 410 of the method 400A.

Figure 34:
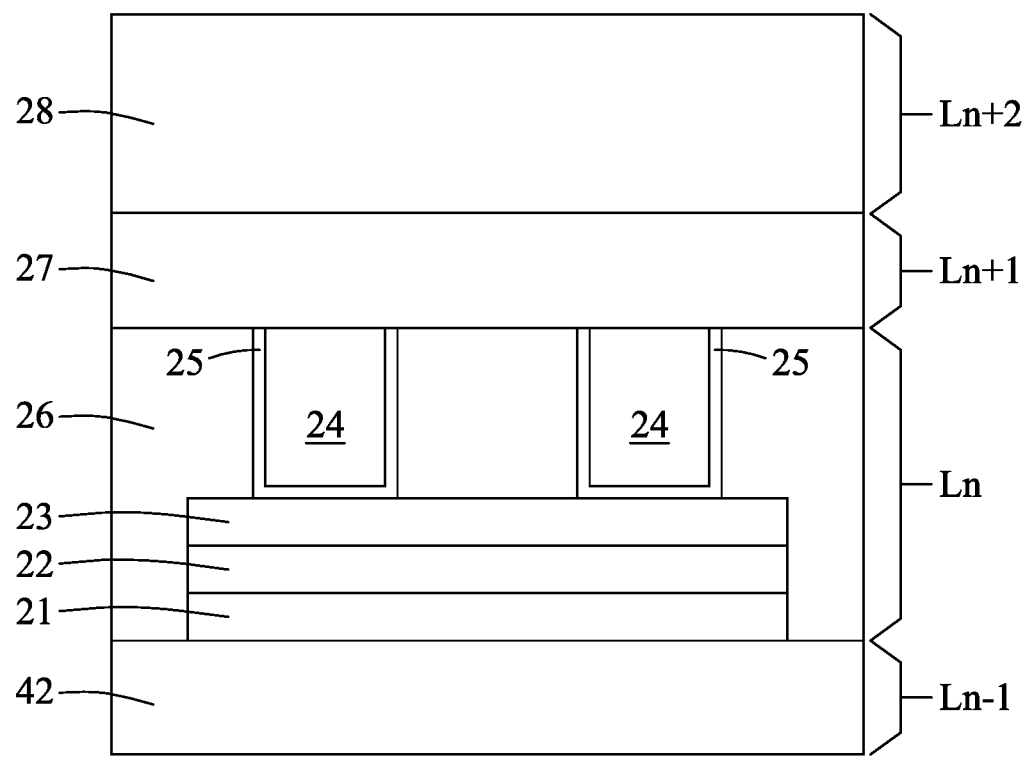
FIGS. 34 to 38 illustrate schematic views of the intermediate stages in manufacturing the semiconductor structure shown in FIG. 33.

FIG. 34 illustrates a sub-step 4101 for formation of the ILD layer 27 and the ILD layer 28. The materials and formation for the ILD layers 27, 28 may be similar to those for the ILD layer 26 described above in step 405, and the details thereof are omitted for the sake of brevity.

Figure 35:
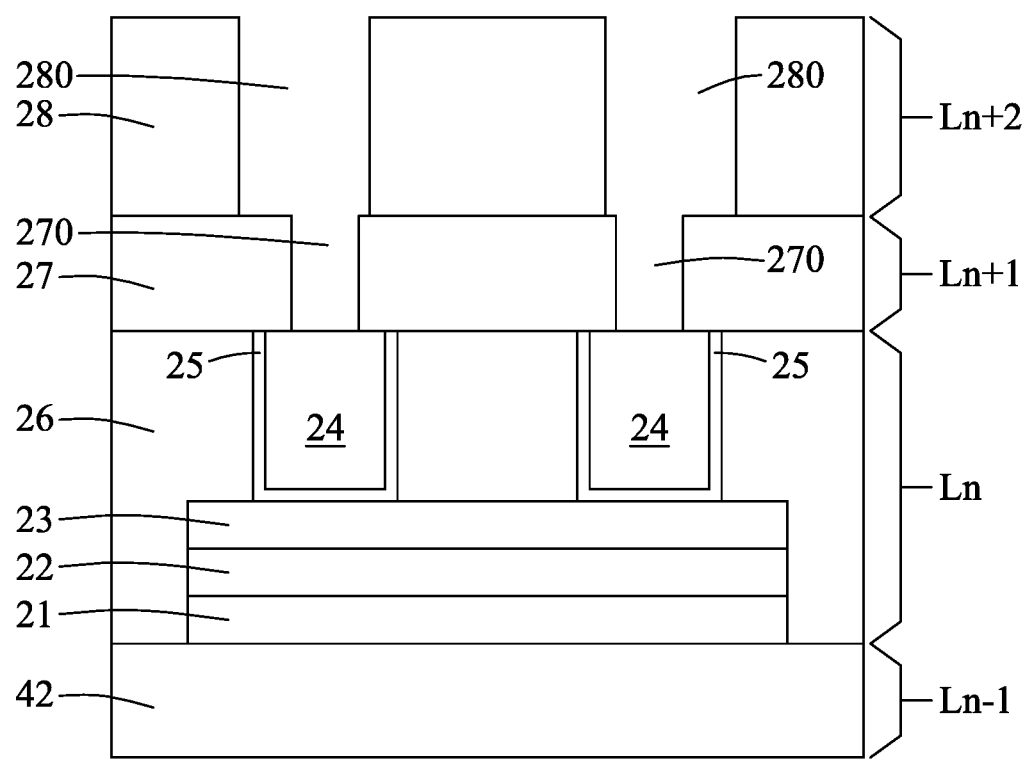

FIG. 35 illustrates a sub-step 4102 for forming two trenches 280 in the ILD layer 28 and two via openings 270 in the ILD layer 27. The trenches 280 and the via openings 270 may be formed using a known dual damascene trench and via etch process or other suitable processes.

Figure 36:
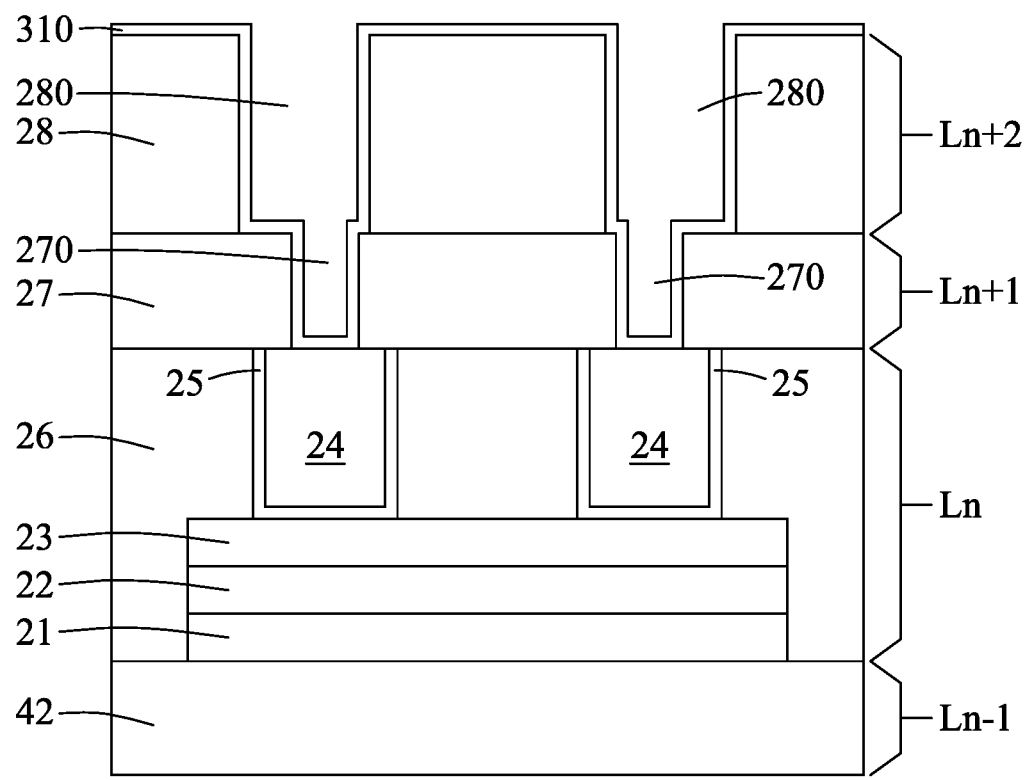

FIG. 36 illustrates a sub-step 4103 for formation of a conformal liner layer 310 over the ILD layer 28 and along inner surfaces of the trenches 280 and the via openings 270. The formation and materials for the conformal liner layer 310 are similar to those for the conformal liner layer 250 described above in step 407, and the details thereof are omitted for the sake of brevity.

Figure 37:
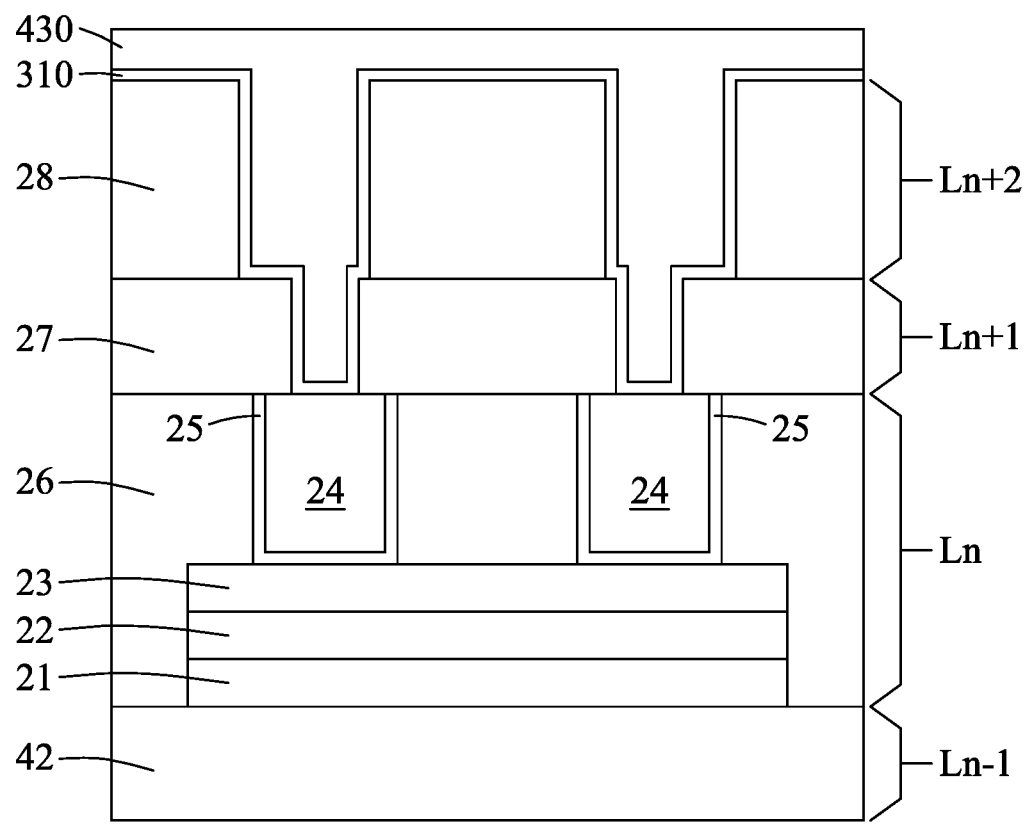

FIG. 37 illustrates a sub-step 4104 for forming a metal filling layer 430 over the conformal liner layer 310 to fill the trenches 280 and the via openings 270 shown in FIG. 36. The materials and the formation for the metal filling layer 430 are similar to those for the contact material layer 240 described above in step 408, and the details thereof are omitted for the sake of brevity.

Figure 38:
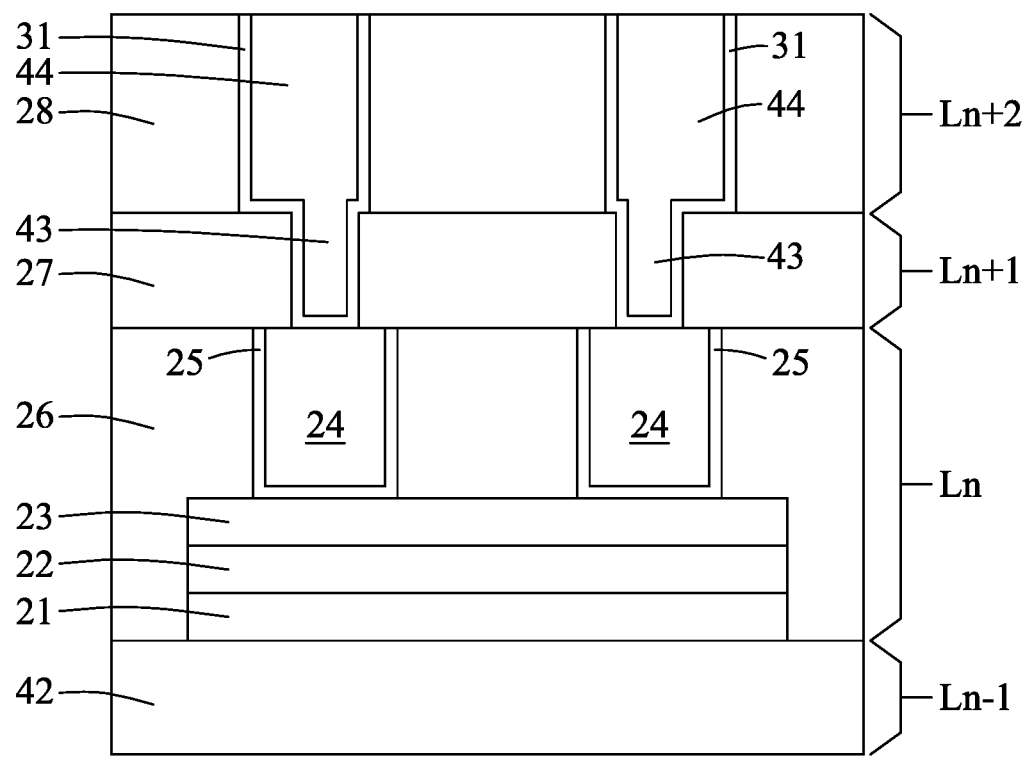

FIG. 38 illustrates a sub-step 4105 for removing the excess of the conformal liner layer 310 and the metal filling layer 430 on the ILD layer 28 so as to form two barrier liners 31 each surrounding two corresponding ones of the contact vias 43 and the metal lines 44. The removal of the excess may be implemented using a CMP process or other suitable techniques. In alternative embodiments, other suitable methods may also be applied for forming the semiconductor structure shown in FIGS. 32 and 33. In yet alternative embodiments, additional features may be added in the semiconductor structure shown in FIGS. 32 and 33, and some features in the semiconductor structure shown in FIGS. 32 and 33 may be modified, replaced, or eliminated without departure of the spirit and scope of the present disclosure.

Figure 39:
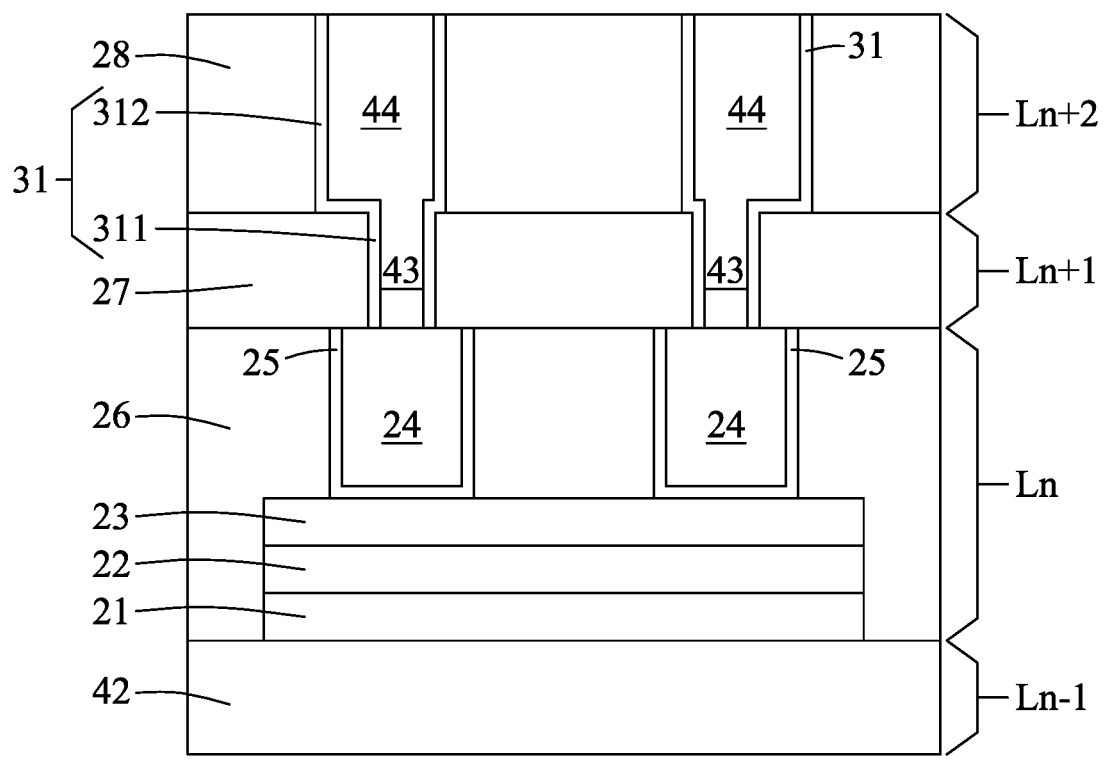
FIG. 39 is a schematic cross-sectional view illustrating a semiconductor structure in accordance with some embodiments.
Figure 40:
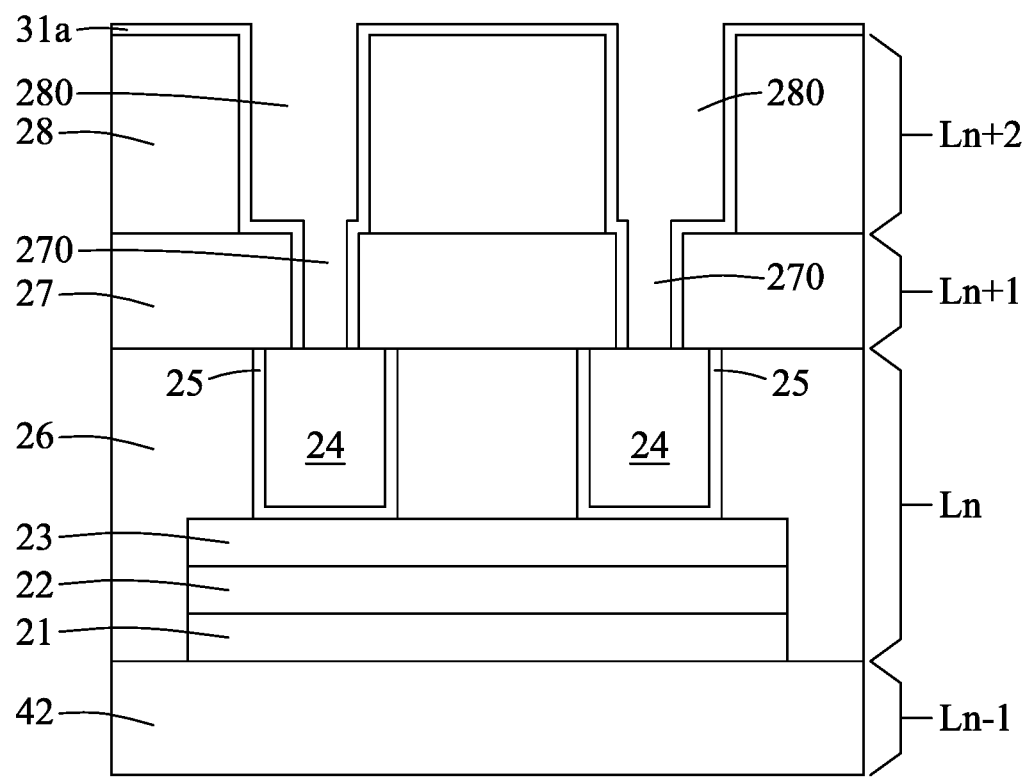
FIG. 40 illustrates a schematic view of the intermediate stage in manufacturing the semiconductor structure shown in FIG. 39.

FIG. 39 illustrates a schematic cross-sectional view of a semiconductor structure in accordance with some embodiments. The semiconductor structure in FIG. 39 is similar to that in FIG. 33 or 38, except that in the semiconductor structure in FIG. 39, each of the barrier liners 31 is not formed between each of the source/drain contacts 24 and a respective one of the contact vias 43. The semiconductor structure shown in FIG. 39 may be formed using a method similar to the method 400A, except for sub-step 4103. FIG. 40 illustrates a schematic view of the intermediate stage for sub-step 4103.

Referring to FIG. 40, in sub-step 4103 for forming the semiconductor structure shown in FIG. 39, a liner layer 31a is not conformally formed over the ILD layer 28 along the inner surfaces of the trenches 280 and the via openings 270, and is selectively grown on the ILD layers 27, 28 through a selective epitaxial process. In other words, the liner layer 31a is grown on the dielectric material (i.e., the ILD layers 27, 28), but is not grown on the metal material (i.e., the source/drain contacts 24).

In addition, in the semiconductor structure shown in FIG. 39, each of the barrier liners 31 may include a first liner portion 311 surrounding one of the contact vias 43 and a second liner portion 312 surrounding a corresponding one of the metal lines 44. In some embodiments, the contact vias 43, the metal lines 44, and the barrier liners 31 may be formed in a dual damascene structure. In alternative embodiments, the contact vias 43 and the first liner portions 311 of the barrier liners 31 may be formed in a single damascene process, and the metal lines 44 and the second liner portions 312 of the barrier liners 31 may be formed in another single damascene process.

In alternative embodiments, other suitable methods may also be applied for forming the semiconductor structure shown in FIG. 39. In yet alternative embodiments, additional features may be added in the semiconductor structure shown in FIG. 39, and some features in the semiconductor structure shown in FIG. 39 may be modified, replaced, or eliminated without departure of the spirit and scope of the present disclosure.

In this disclosure, a barrier liner is provided around each of the source/drain contacts, and thus hydrogen (e.g., hydrogen gas and/or free hydrogen atoms which may be used or generated in many processes, such as CVD) may be prevented from diffusion through the barrier liner to the channel layer. As such, the channel layer may be less likely to be doped by the hydrogen gas and/or the free hydrogen atoms, and a threshold voltage of the semiconductor device (e.g., the thin film transistor) may not be affected. In addition, because the hydrogen gas and/or the free hydrogen atoms may be absorbed by the barrier liner (e.g., In-rich oxide layer), a Schottky barrier may be improved and a contact resistance to the channel layer may be reduced. Furthermore, additional barrier liners may be formed to surround the connectors (such as the contact vias, the metal lines, or the like) and/or to surround the gate electrode above the channel layer. Those connectors may be in electrical contact with the source/drain contacts, respectively.

In accordance with some embodiments of the present disclosure, a semiconductor device includes a channel layer, source/drain contacts, and first barrier liners. The channel layer includes an oxide semiconductor material. The source/drain contacts are disposed in electrical contact with the channel layer. The first barrier liners respectively surround the source/drain contacts, and include a hydrogen barrier material so as to prevent hydrogen from diffusion through the first barrier liners to the channel layer.

In accordance with some embodiments of the present disclosure, a semiconductor structure includes a channel layer, source/drain contacts, first barrier liners, and connectors. The channel layer includes an oxide semiconductor material. The source/drain contacts are disposed in electrical contact with the channel layer. The first barrier liners respectively surround the source/drain contacts, and include a hydrogen barrier material so as to prevent hydrogen from diffusion through the first barrier liners to the channel layer. The connectors are disposed in electrical contact with the source/drain contacts, respectively.

In accordance with some embodiments of the present disclosure, a method for manufacturing a semiconductor device includes: forming a channel layer which includes an oxide semiconductor material; forming source/drain contacts over the channel layer to be in electrical contact with the channel layer; and forming first barrier liners each being disposed between the channel layer and a respective one of the source/drain contacts, the first barrier liners including a hydrogen barrier material so as to prevent hydrogen from diffusion through the first barrier liners to the channel layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a channel layer including an oxide semiconductor material;
source/drain contacts disposed in connection with the channel layer;
connectors disposed in connection with the source/drain contacts, respectively; and
first barrier liners which respectively surround the connectors, and which include a hydrogen barrier material so as to prevent hydrogen from diffusion through the first barrier liners,
wherein the source/drain contacts include cobalt, tungsten, copper, titanium, tantalum, aluminum, zirconium, hafnium, or combinations thereof.

2. The semiconductor device of claim 1, wherein the hydrogen barrier material includes an In-rich oxide material.

3. The semiconductor device of claim 1, wherein the hydrogen barrier material includes indium oxide, indium gallium zinc oxide, a semiconductor material including indium, gallium, zinc, silicon, and oxide, tungsten-doped indium oxide, indium tin oxide, indium zinc oxide, zinc oxide, gallium oxide, a metal compound including zinc and nickel, or combinations thereof.

4. The semiconductor device of claim 1, wherein the oxide semiconductor material includes indium gallium zinc oxide, tungsten-doped indium oxide, indium zinc oxide, indium tin oxide, gallium oxide, indium oxide, or combinations thereof.

5. The semiconductor device of claim 1, further comprising:
a gate electrode; and
a gate dielectric layer disposed between the gate electrode and the channel layer.

6. The semiconductor device of claim 5, wherein the source/drain contacts are spaced apart from each other and are disposed above the channel layer.

7. The semiconductor device of claim 6, wherein the gate electrode is disposed beneath the gate dielectric layer, and the gate dielectric layer is disposed beneath the channel layer.

8. The semiconductor device of claim 6, wherein the gate electrode is disposed between the source/drain contacts, and the gate dielectric layer is disposed to surround the gate electrode.

9. The semiconductor device of claim 8, further comprising a second barrier liner located between the gate electrode and the gate dielectric layer, the second barrier liner including the hydrogen barrier material so as to prevent the hydrogen from diffusion through the second barrier liner.

10. The semiconductor device of claim 5, wherein the semiconductor device is a back-end-of-line transistor.

11. A semiconductor structure comprising:
a channel layer including an oxide semiconductor material;
source/drain contacts disposed in connection with the channel layer;

connectors disposed in connection with the source/drain contacts, respectively; and first barrier liners which respectively surround the connectors, and which include a hydrogen barrier material so as to prevent hydrogen from diffusion through the first barrier liners.

12. The semiconductor structure of claim 11, wherein the hydrogen barrier material includes an In-rich oxide material.

13. The semiconductor structure of claim 11, wherein the hydrogen barrier material includes indium oxide, indium gallium zinc oxide, a semiconductor material including indium, gallium, zinc, silicon, and oxide, tungsten-doped indium oxide, indium tin oxide, indium zinc oxide, zinc oxide, gallium oxide, a metal compound including zinc and nickel, or combinations thereof.

14. The semiconductor structure of claim 11, wherein the oxide semiconductor material includes indium gallium zinc oxide, indium tungsten oxide, indium zinc oxide, indium tin oxide, gallium oxide, indium oxide, or combinations thereof.

15. A method for manufacturing a semiconductor device, comprising:

forming a channel layer which includes an oxide semiconductor material;

forming source/drain contacts over the channel layer to be in connection with the channel layer;

forming connectors which are disposed in connection with the source/drain contacts, respectively; and forming first barrier liners which respectively surround the connectors, and which include a hydrogen barrier material so as to prevent hydrogen from diffusion through the first barrier liners.

16. The method of claim 15, further comprising:
forming a gate electrode; and
forming a gate dielectric layer such that the gate dielectric layer is disposed between the gate electrode and the channel layer.

17. The method of claim 16, wherein the gate electrode is formed between the source/drain contacts, and the gate dielectric layer is formed to surround the gate electrode.

18. The method of claim 17, further comprising:
forming a second barrier liner between the gate electrode and the gate dielectric layer, the second barrier liner including the hydrogen barrier material so as to prevent the hydrogen from diffusion through the second barrier liner to the channel layer.

19. The method of claim 15, wherein the hydrogen barrier material includes indium oxide, indium gallium zinc oxide, a semiconductor material including indium, gallium, zinc, silicon, and oxide, tungsten-doped indium oxide, indium tin oxide, indium zinc oxide, zinc oxide, gallium oxide, a metal compound including zinc and nickel, or combinations thereof.

20. The method of claim 15, wherein the source/drain contacts include cobalt, tungsten, copper, titanium, tantalum, aluminum, zirconium, hafnium, or combinations thereof.

* * * * *